US011189790B2

(12) United States Patent
Lin et al.

(10) Patent No.: US 11,189,790 B2
(45) Date of Patent: Nov. 30, 2021

(54) SPACER-BASED PATTERNING FOR TIGHT-PITCH AND LOW-VARIABILITY RANDOM ACCESS MEMORY (RAM) BIT CELLS AND THE RESULTING STRUCTURES

(71) Applicant: Intel Corporation, Santa Clara, CA (US)

(72) Inventors: Kevin L. Lin, Beaverton, OR (US); Sarah E. Atanasov, Beaverton, OR (US); Kevin P. O'Brien, Portland, OR (US); Robert L. Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 16/320,789

(22) PCT Filed: Sep. 30, 2016

(86) PCT No.: PCT/US2016/054760
§ 371 (c)(1),
(2) Date: Jan. 25, 2019

(87) PCT Pub. No.: WO2018/063322
PCT Pub. Date: Apr. 5, 2018

(65) Prior Publication Data
US 2019/0165270 A1    May 30, 2019

(51) Int. Cl.
*H01L 45/00* (2006.01)
*H01L 27/24* (2006.01)

(52) U.S. Cl.
CPC ........ *H01L 45/146* (2013.01); *H01L 27/2436* (2013.01); *H01L 27/2463* (2013.01);
(Continued)

(58) Field of Classification Search
CPC ............ H01L 27/2481; H01L 27/2463; H01L 27/2436; H01L 45/1233; H01L 45/00;
(Continued)

(56) References Cited

U.S. PATENT DOCUMENTS 6,953,964 B2   10/2005 Yuan et al.
2005/0094456 A1  5/2005 Lee et al.
(Continued)

OTHER PUBLICATIONS

International Search Report and Written Opinion for International Patent Application No. PCT/US2016/054760 dated Apr. 25, 2017, 11 pgs.
(Continued)

*Primary Examiner* — Marcos D. Pizarro
*Assistant Examiner* — Antonio B Crite
(74) *Attorney, Agent, or Firm* — Schwabe, Williamson & Wyatt, P.C.

(57) ABSTRACT

Spacer-based patterning for tight-pitch and low-variability random access memory (RAM) bit cells, and the resulting structures, are described. In an example, a semiconductor structure includes a substrate having a top layer. An array of non-volatile random access memory (RAM) bit cells is disposed on the top layer of the substrate. The array of non-volatile RAM bit cells includes columns of non-volatile RAM bit cells along a first direction and rows of non-volatile RAM bit cells along a second direction orthogonal to the first direction. A plurality of recesses is in the top layer of the substrate, along the first direction between columns of the array of non-volatile RAM bit cells.

25 Claims, 12 Drawing Sheets

(52) U.S. Cl.
CPC .......... *H01L 27/2481* (2013.01); *H01L 45/00* (2013.01); *H01L 45/085* (2013.01); *H01L 45/124* (2013.01); *H01L 45/1233* (2013.01); *H01L 45/1266* (2013.01); *H01L 45/141* (2013.01); *H01L 45/147* (2013.01); *H01L 45/1675* (2013.01)

(58) Field of Classification Search
CPC .. H01L 45/146; H01L 45/085; H01L 27/2409
See application file for complete search history.

(56) References Cited

U.S. PATENT DOCUMENTS

| | | |
|---|---|---|
| 2013/0043455 A1 | 2/2013 | Bateman |
| 2013/0295737 A1 | 11/2013 | Tang et al. |
| 2014/0273358 A1 | 9/2014 | Zahurak et al. |
| 2016/0027845 A1* | 1/2016 | Seong ................. H01L 27/2463 257/5 |
| 2018/0047784 A1* | 2/2018 | Ohba ..................... H01L 45/06 |

OTHER PUBLICATIONS

International Preliminary Report on Patentability for International Patent Application No. PCT/US2016/054760 dated Apr. 11, 2019, 8 pgs.

\* cited by examiner

SPACER-BASED PATTERNING FOR TIGHT-PITCH AND LOW-VARIABILITY RANDOM ACCESS MEMORY (RAM) BIT CELLS AND THE RESULTING STRUCTURES

CROSS-REFERENCE TO RELATED APPLICATION

This patent application is a U.S. National Phase Application under 35 U.S.C. § 371 of International Application No. PCT/US2016/054760, filed Sep. 30, 2016, entitled "SPACER-BASED PATTERNING FOR TIGHT-PITCH AND LOW-VARIABILITY RANDOM ACCESS MEMORY (RAM) BIT CELLS AND THE RESULTING STRUCTURES," which designates the United States of America, the entire disclosure of which is hereby incorporated by reference in its entirety and for all purposes.

TECHNICAL FIELD

Embodiments of the invention are in the field of integrated circuit fabrication and, in particular, spacer-based patterning for tight-pitch and low-variability random access memory (RAM) bit cells, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on magnetic state change or resistance change is commonly anticipated as a replacement technology for flash memory. However, the processing of the material layers needed to fabricate devices based on magnetic state change or resistance change has proven problematic. Also, for low voltage non-volatile embedded applications, operating voltages less than 1V and compatible with CMOS logic processes may be desirable but challenging to achieve.

Thus, significant improvements are still needed in the area of nonvolatile memory device manufacture and operation.

DESCRIPTION OF THE EMBODIMENTS

Figure 1A:
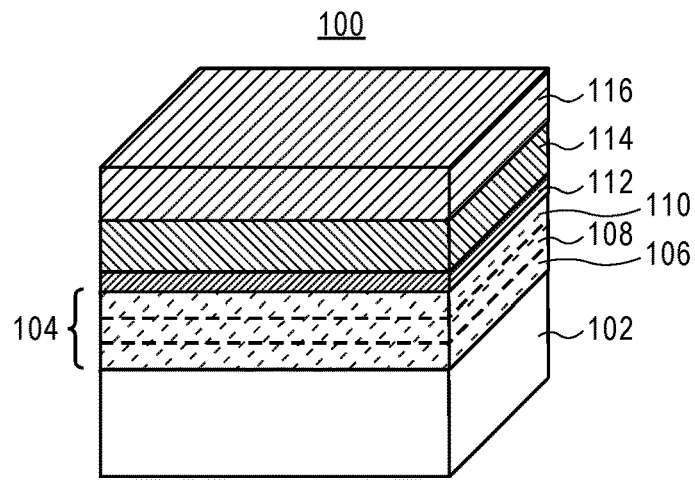
FIGS. 1A-1O illustrate angled cross-sectional views of various operations in a method involving spacer-based patterning for fabricating non-volatile random access memory (RAM) bit cells, in accordance with an embodiment of the present invention.

Spacer-based patterning for tight-pitch and low-variability random access memory (RAM) bit cells, and the resulting structures, are described. In the following description, numerous specific details are set forth, such as specific RAM material regimes and structure architectures, in order to provide a thorough understanding of embodiments of the present invention. It will be apparent to one skilled in the art that embodiments of the present invention may be practiced without these specific details. In other instances, well-known features, such as operations associated with embedded memory, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to spacer-based patterning for tight-pitch, low-variability, memory bit cells. To provide context, memory bit cells are repeated arrays of "bits." To maximize density, it may be desirable to minimize the size of the bit cell, minimize the pitch between bit cells, or minimize both the size of the bit cell and the pitch between bit cells. However, reducing the size of the bit cells increases variability, and there may be resolution limits to lithography which limit the pitch of the bit cells.

In accordance with one or more embodiments of the present invention, features that are defined by spacers have lower variability than lithographically-defined features. In one embodiment, dimensions that are spacer-defined are used to define the "edges" of memory bit cells to both minimize the size of the bit cell and the pitch between bit cells. In one embodiment, spacer-based pitch division is implemented to improve density. For example, a cross-grating is used to pattern an array of pillars that is then used as a hardmask to define an array of memory bit cells.

More generally, one or more embodiments of the present invention are directed to methods for integrating RAM memory arrays into a logic processor, such as spin torque transfer random access memory (STTRAM) arrays, resistive random access memory (RRAM) arrays, or conductive bridge random access memory (CBRAM) memory arrays. Particular embodiments may be suitable for fabricating embedded non-volatile memory (e-NVM). Approaches described herein may provide a fabrication pathway for high performance RAM cells and increase the potential of using scaled RAM cells for future e-NVM needs, such as for integration in system on chip (SoC) products.

Advantages for implementing one or more embodiments of the present invention may include a realization of lower variability among bit cells of an array of bit cells. By using spacer defined features, size variation of memory bit cells may be reduced to improves reliability. Increased density may also be achieved using spacer-based pitch division to decrease the pitch of an array of memory bit cells.

Figure 1B:
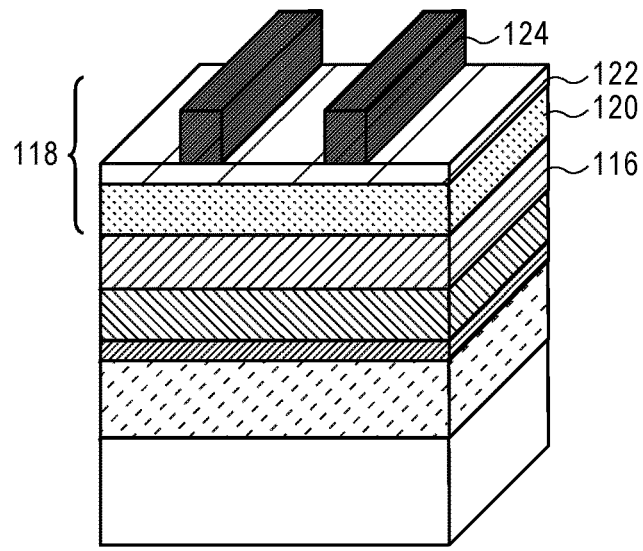
Figure 1C:
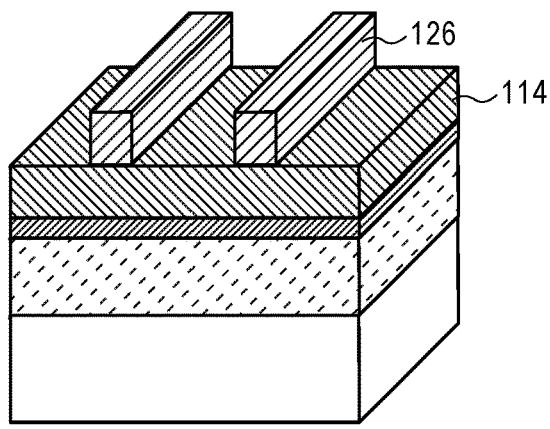
Figure 1D:
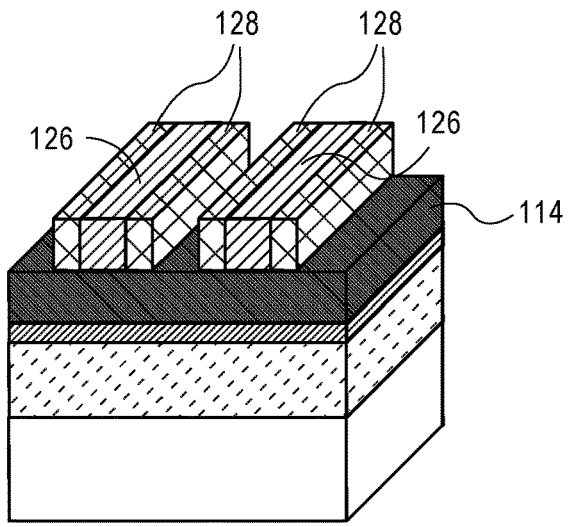
Figure 1E:
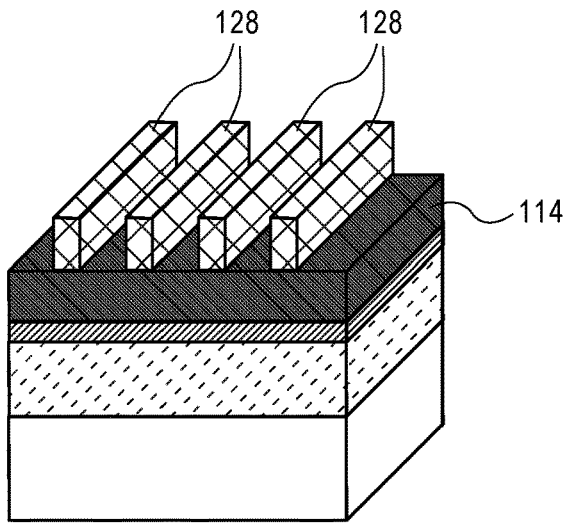
Figure 1F:
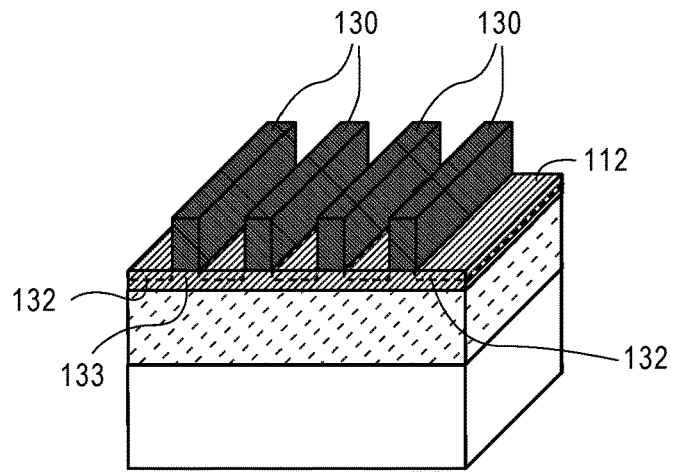
Figure 1G:
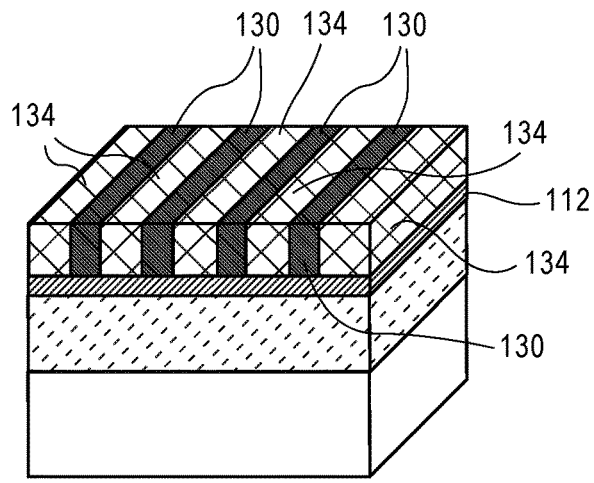
Figure 1H:
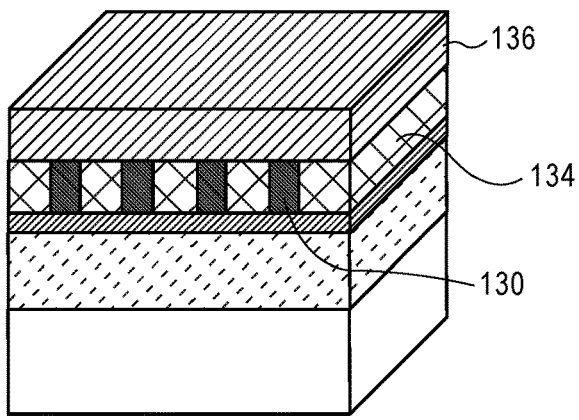
Figure 1I:
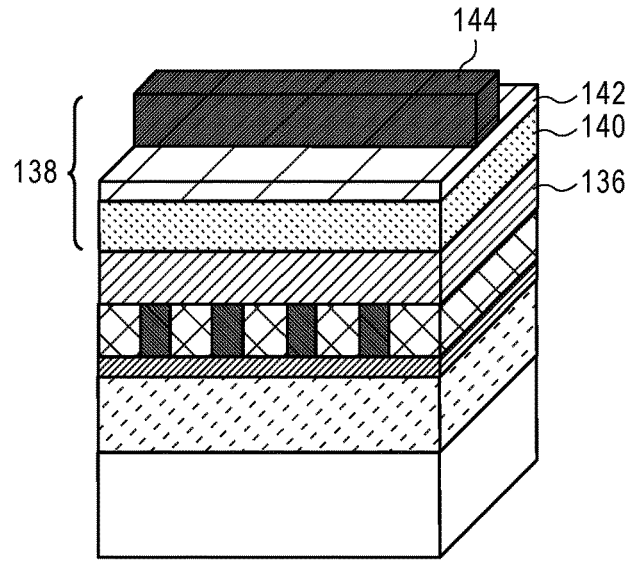
Figure 1J:
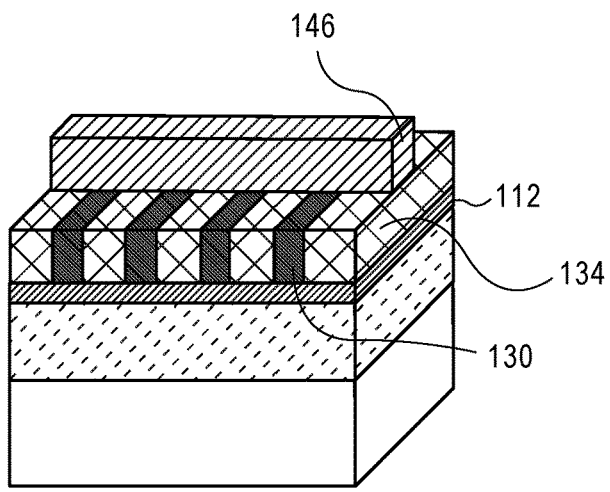
Figure 1K:
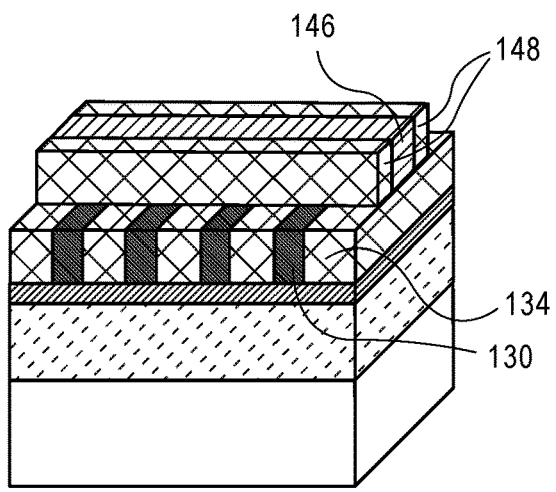
Figure 1L:
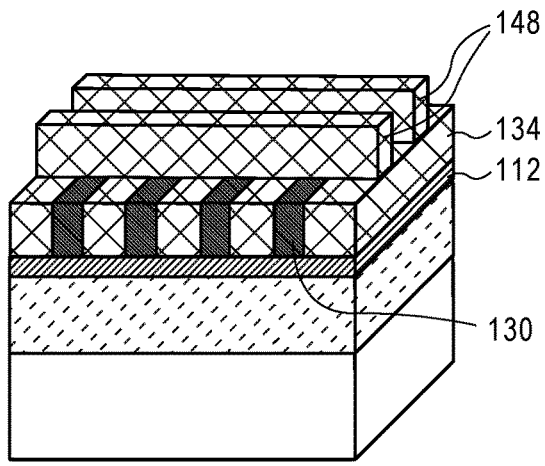
Figure 1M:
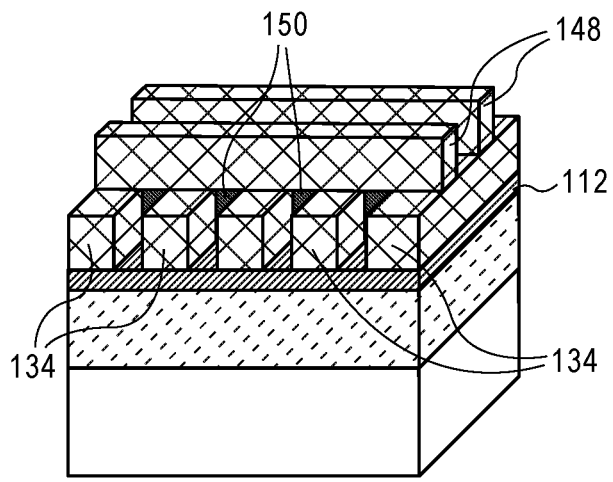
Figure 1N:
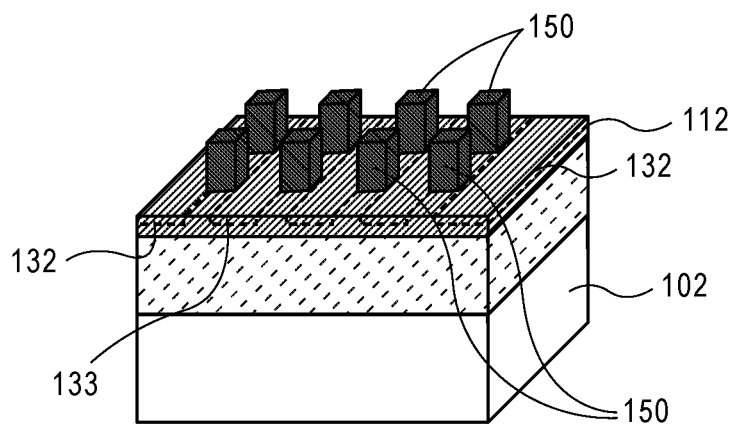
Figure 1O:
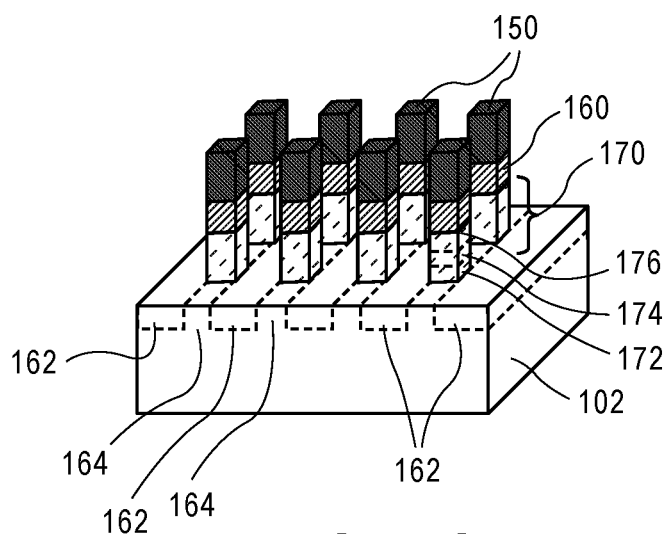

FIGS. 1A-1O illustrate angled cross-sectional views of various operations in a method involving spacer-based patterning for fabricating non-volatile random access memory (RAM) bit cells, in accordance with an embodiment of the present invention. It is to be appreciated that the illustrated particular patterning layers or stacks described below in association with FIGS. 1A-1O, such particular hardmask materials, are provided as exemplary embodiments. One of skill in the art will appreciate that other materials or specific patterning stacks may be implemented within the spirit and scope of embodiments of the present invention.

Referring to FIG. 1A, an initial material stack 100 is provided as an exemplary starting structure. A memory material stack 104 (which may include several layers, as is indicated by the exemplary dashed lines separating exemplary memory layers 106, 108 and 110) is formed above a substrate 102. An array hardmask layer 112 is formed above the memory material stack 104. A pattern accumulation hardmask layer 114 is formed above the array hardmask layer 112. A first pitch division hardmask layer 116 is formed above the pattern accumulation layer 114. In an embodiment, the memory material stack 104 includes a lower electrode material layer 106, a switching element layer or stack of layers 108, and an upper electrode material layer 110.

In an embodiment, as is also used throughout the present description, hardmask materials are composed of one or more dielectric materials. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition methods. Referring again to FIG. 1A, in an embodiment, the array hardmask layer 112 is a silicon nitride layer, the pattern accumulation hardmask layer 114 is a titanium nitride (TiN) layer, and the first pitch division hardmask layer 116 is an amorphous silicon (a-Si) layer.

Referring to FIG. 1B, a first backbone patterning stack 118 is formed on the structure 100 of FIG. 1A. In an exemplary embodiment, as shown, the first backbone patterning stack 118 is a trilayer mask composed of a topographic masking portion 120 (also known as a planarization layer), an anti-reflective coating (ARC) layer 122, and a photoresist layer 124. In a particular such embodiment, the topographic masking portion 120 is a carbon hardmask (CHM) layer and the anti-reflective coating layer 122 is a silicon ARC layer. The photoresist layer 124 is a suitable photoresist material compatible with the selected lithographic process used for patterning. In one such embodiment, the photoresist layer 124 is patterned to provide a plurality of lines using 193 nm immersion litho (i193), EUV and/or EBDW lithography, or the like. It is to be appreciated that a positive tone or a negative tone resist may be used.

Referring to FIG. 1C, the pattern of the photoresist layer 124 is transferred to the first pitch division hardmask layer 116 to form a first backbone layer 126. In an embodiment, an etch process is used to transfer the pattern of the photoresist layer 124 to the first pitch division hardmask layer 116. In an embodiment, a cleans process is used to remove residual portions of the topographic masking portion 120, the anti-reflective coating (ARC) layer 122, and the photoresist layer 124 that remain following the etch process.

Referring to FIG. 1D, spacers 128 are formed along the sidewalls of each of the features of the first backbone layer 126. In an embodiment, the spacers 128 are formed by first depositing a spacer material layer conformal with the first backbone layer 126, and then anisotropically etching the spacer material layer to provide the spacers 128. In a specific embodiment, the first backbone layer 126 is an amorphous silicon (a-Si) layer and the spacers 128 are silicon oxide spacers. In other embodiments, a different dielectric material, such as silicon nitride or carbon-doped silicon nitride, is used for the spacers 128.

Referring to FIG. 1E, the first backbone layer 126 is removed, leaving spacers 128. In an embodiment, the first backbone layer 126 is removed using a wet etch or dry etch process selective to the spacers 128 and selective to the underlying pattern accumulation hardmask layer 114. The resulting pattern of the spacers 128 without the first backbone layer 126 provides a first spacer or pitch division patterning mask.

Thus, in an embodiment, a spacer-based patterning or pitch division processing and patterning scheme is implemented to enable embodiments described herein. Pitch division patterning typically refers to pitch halving, pitch quartering etc. In accordance with one or more embodiments described herein, optical lithography is first implemented to print or pattern unidirectional lines (e.g., either strictly unidirectional or predominantly unidirectional) in a pre-defined pitch, for example to provide the first backbone layer 126 having an initial pitch. Pitch division processing is then implemented as a technique to increase line density. For example, pitch halving is illustrated in the process described in association with FIGS. 1C-1E.

In an embodiment, the term "grating structure" for hardmask lines (such as back bone lines), or metal lines, or ILD lines is used herein to refer to a tight pitch and repeating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like patterns described herein may have metal lines, ILD lines or hardmask lines spaced at a constant pitch and having a constant width.

In an example, pitch halving can be implemented to double the line density of a fabricated grating structure. The resulting pattern of the spacers has double the density, or half the pitch or the features of the original mask or backbone structure. The pattern of the spacers may then be transferred, e.g., by an etch process, to an underlying hardmask material layer, as described below. In one such embodiment, the grating pattern has unidirectional lines, as is shown. Even further, although not shown, the original pitch may be quartered by a second round of spacer mask patterning. Accordingly, the grating-like pattern of FIG. 1E include lines spaced at a constant pitch and having a constant width relative to one another. The dimensions achieved may be far smaller than the critical dimension of the lithographic technique employed.

Referring to FIG. 1F, the pattern of the first spacer or pitch division patterning mask formed by spacers 128 is transferred to the pattern accumulation hardmask layer 114 to form a first-time patterned pattern accumulation hardmask layer 130. In one embodiment, the first-time patterned pattern accumulation hardmask layer 130 is a grating of lines after the first patterning, as is depicted. In an embodiment, an etch process is used to transfer the pattern of the spacers 128 to the pattern accumulation hardmask layer 114. In an embodiment, a cleans process is used to remove the spacers 128 following the etch process.

Referring again to FIG. 1F, in an embodiment, the etch process used to transfer the pattern of the first spacer or pitch division patterning mask formed by spacers 128 to the pattern accumulation hardmask layer 114 is not entirely selective to the underlying array hardmask layer 112. In one such embodiment, recesses 132 are formed into the upper surface of the array hardmask layer 112, as indicated by the dashed lines in FIG. 1F. The recesses 132 are parallel with the lines of the first-time patterned pattern accumulation hardmask layer 130. In an embodiment where recesses 132 are formed, the array hardmask layer 112 has a topography where regions 133 are not recessed because they are protected by the first-time patterned pattern accumulation hardmask layer 130. Recesses 132 are between the regions 133. The topography may ultimately be transferred to the final permanent structure, as is described in greater detail below in association with FIGS. 2 and 3.

Referring to FIG. 1G, a sacrificial fill material 134 is formed in openings, e.g., between lines, of first-time patterned pattern accumulation hardmask layer 130. In an embodiment, the sacrificial material is deposited in excess on the structure of FIG. 1F and then planarized, e.g., by a chemical mechanical planarization process. In a specific embodiment, the first-time patterned pattern accumulation hardmask layer 130 is a titanium nitride (TiN) layer, and the sacrificial material is a silicon oxide material.

Referring to FIG. 1H, a second pitch division hardmask layer 136 is formed on the structure of FIG. 1G. In an embodiment, the second pitch division hardmask layer 136 is an amorphous silicon (a-Si) layer. In an embodiment, the second pitch division hardmask layer 136 is deposited using a chemical vapor deposition (CVD) process.

Referring to FIG. 1I, a second backbone patterning stack 138 is formed on the structure of FIG. 1H. In an exemplary embodiment, as shown, the second backbone patterning stack 138 is a trilayer mask composed of a topographic masking portion 140, an anti-reflective coating (ARC) layer 142, and a photoresist layer 144. In a particular such embodiment, the topographic masking portion 140 is a carbon hardmask (CHM) layer and the anti-reflective coating layer 142 is a silicon ARC layer. The photoresist layer 144 is a suitable photoresist material compatible with the selected lithographic process used for patterning. In one such embodiment, the photoresist layer 144 is patterned to provide a plurality of lines using 193 nm immersion litho (i193), EUV and/or EBDW lithography, or the like. It is to be appreciated that a positive tone or a negative tone resist may be used. The photoresist layer 144 is a pattern of lines (one shown) orthogonal to the lines of the first-time patterned pattern accumulation hardmask layer 130.

Referring to FIG. 1J, the pattern of the photoresist layer 144 is transferred to the second pitch division hardmask layer 136 to form a second backbone layer 146. In an embodiment, an etch process is used to transfer the pattern of the photoresist layer 144 to the second pitch division hardmask layer 136. In an embodiment, a cleans process is used to remove residual portions of the topographic masking portion 140, the anti-reflective coating (ARC) layer 142, and the photoresist layer 144 that remain following the etch process. In an embodiment, the lines (only one shown in FIG. 1J) of the second pitch division hardmask layer 136 have a same pitch as the lines of the first pitch division hardmask layer 116.

Referring to FIG. 1K, spacers 148 are formed along the sidewalls of each of the features of the second backbone layer 146. In an embodiment, the spacers 148 are formed by first depositing a spacer material layer conformal with the second backbone layer 146, and then anisotropically etching the spacer material layer to provide the spacers 148. In a specific embodiment, the second backbone layer 146 is an amorphous silicon (a-Si) layer and the spacers 148 are silicon oxide spacers.

Referring to FIG. 1L, the second backbone layer 146 is removed, leaving spacers 148. In an embodiment, the second backbone layer 146 is removed using a wet etch or dry etch process selective to the spacers 148. The resulting pattern of the spacers 148 without the second backbone layer 146 provides a second spacer or pitch division patterning mask. In an embodiment, then, the first spacer-based patterning process used to form the spacers 128 is a first pitch halving pitch division processing scheme, and the second spacer-based patterning process used to form the spacers 148 is a second pitch halving pitch division processing scheme. In one such embodiment, the initial pitch is the same for both processes.

Referring to FIG. 1M, the pattern of the second spacer or pitch division patterning mask formed by spacers 148 is transferred to the first-time patterned pattern accumulation hardmask layer 130 to form a second-time patterned pattern accumulation hardmask layer 150. In one embodiment, the second-time patterned pattern accumulation hardmask layer 150 is a plurality of pillars formed by effectively cutting the grating of lines resulting from the first patterning with a second set of lines in an orthogonal direction. In an embodiment, an etch process is used to transfer the pattern of the spacers 148 to the first-time patterned pattern accumulation hardmask layer 130.

Referring to FIG. 1N, the spacers 148 and the sacrificial material 134 are removed from the structure of FIG. 1M. In an embodiment, a cleans process is used to remove the spacers 148 and the sacrificial material 134 following the etch process used to form the second-time patterned pattern accumulation hardmask layer 150. Upon removing the spacers 148 and the sacrificial material 134, the array hardmask layer 112 is re-exposed. As shown in FIG. 1N, in an embodiment where recesses 132 are formed as described in association with FIG. 1F, the recesses 132 remain along one direction of the array of pillars of the second-time patterned pattern accumulation hardmask layer 150.

Referring to FIG. 1O, the pattern of the second-time patterned pattern accumulation hardmask layer 150 is transferred to the array hardmask layer 112 and to the memory material stack 104 to form an array of pillars, each having an array hardmask 160 on a random access memory (RAM) material stack 170. In one embodiment, each random access memory (RAM) material stack 170 includes a lower electrode layer 172, a switching layer (or stack of layers including a switching layer) 174, and an upper electrode layer 176, as is depicted in FIG. 1O.

Referring again to FIG. 1O, in an embodiment, in a case where recesses 132 are formed in the array hardmask layer 112, the topography of regions 132/133 of the array hardmask layer 112 is transferred to the underlying substrate 102 (or into a top layer associated with substrate 102). In an embodiment, the topography of regions 132/133 of the array hardmask layer 112 leads to unequal etching of the array hardmask layer 112 and the memory material stack 104 during transfer of the pattern of the pattern of the second-time patterned pattern accumulation hardmask layer 150 to these layers. In one such embodiment, the resulting patterned structure includes recesses 162 between non-recessed regions 164 of the underlying substrate 102 (or of a top layer associated with substrate 102).

Thus, referring again to FIGS. 1A-1O, in an embodiment, a method of fabricating a semiconductor structure includes forming a hardmask layer 114 above a memory material stack 104 on a top layer of a substrate 102. A grating structure 130 is formed in the hardmask layer 114 using a first spacer-based patterning process. The grating structure including a plurality of lines along a first direction. The plurality of lines is cut along a second direction orthogonal to the first direction using a second spacer-based patterning process to form a twice-patterned hardmask 150. The memory material stack 104 is etched using the twice-patterned hardmask 150 as a mask to form an array of non-volatile random access memory (RAM) bit cells 170 from the memory material stack 104.

Figure 2:
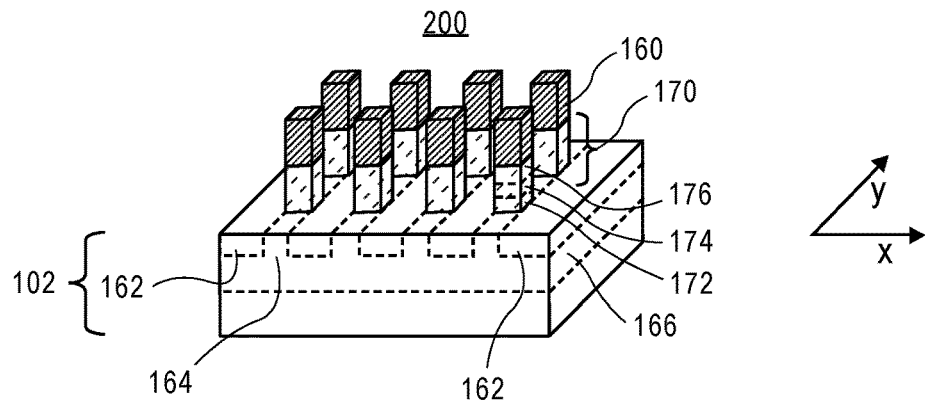
FIG. 2 illustrates an angled cross-sectional view of an array of non-volatile random access memory (RAM) bit cells, in accordance with an embodiment of the present invention.

FIG. 2 illustrates an angled cross-sectional view of an array of non-volatile random access memory (RAM) bit cells, in accordance with an embodiment of the present invention. In an embodiment, the structure 200 of FIG. 2 represents the structure of FIG. 1O following removal of the twice-patterned hardmask 150. Although shown as retained in FIG. 2, it is to be appreciated that the array hardmask 160 may also be removed.

Referring to FIG. 2, the semiconductor structure 200 includes a substrate 102 having a top layer (represented as region 166 above the dashed line in substrate 102 of FIG. 2). An array of non-volatile random access memory (RAM) bit cells 170 is disposed on the top layer 166 of the substrate 102. The array of non-volatile RAM bit cells 170 includes columns of non-volatile RAM bit cells 170 along a first direction (y-direction) and rows of non-volatile RAM bit cells along a second direction (x-direction) orthogonal to the first direction. In an embodiment, the array of non-volatile RAM bit cells 170 has a pitch along the first direction and has the same pitch along the second direction. In one embodiment, the array of non-volatile RAM bit cells 170 is an array of spin torque transfer random access memory (STTRAM) bit cells. In another embodiment, the array of non-volatile RAM bit cells 170 is an array of resistive random access memory (RRAM) bit cells. In another embodiment, the array of non-volatile RAM bit cells 170 is an array of conductive bridge random access memory (CBRAM) bit cells.

In an embodiment, referring again to FIG. 2, the geometry of the memory bit cells 170 can indicate that spacer-based patterning was used to form the array of memory bit cells 170. For example, in one such embodiment, the pitch of the bit cells 170 can indicate that pitch division was used to produce the final array. Furthermore, in a specific embodiment, either the pitch division scheme along the x-direction, the pitch division scheme along the y-direction, or both, results in asymmetries between different populations. For example, in a pitch halving process, the backbone and complement populations may look different. That is, two distinct "spacers" may exist due to mis-match in backbone and complement (spacer) populations. Additionally, it is to be appreciated that memory bit cells may exhibit small variation and may all be the same size as a result of spacer-based patterning.

As described above, recesses 162 may be fabricated, and may remain in the structure 200 of FIG. 2. To further demonstrate such a scenario, FIG. 3 illustrates a plan view of an array of non-volatile random access memory (RAM) bit cells, in accordance with an embodiment of the present invention.

The array of bit cells is shown as 160/170, which provides a plan view of the bit cells 170 of FIG. 2 having the array hardmask 160 thereon. A plurality of recesses 162 is in the top layer of the substrate of FIG. 2, along the first direction (y-direction) between columns of the array of non-volatile RAM bit cells 170. Non-recessed regions 164 remain between rows of the array of non-volatile RAM bit cells 170.

Figure 3:
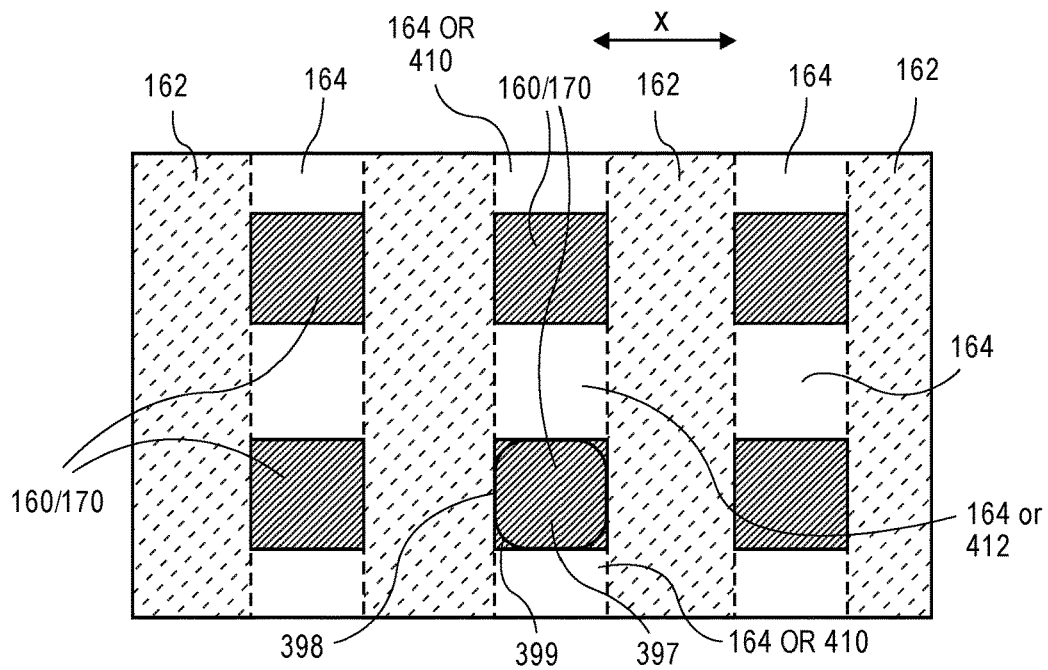
FIG. 3 illustrates a plan view of an array of non-volatile random access memory (RAM) bit cells, in accordance with an embodiment of the present invention.

In an embodiment, as depicted in FIG. 2 and by the structure 160/170 of FIG. 3, each of the non-volatile RAM bit cells 170 has a square geometry from a plan view perspective. The square geometry may result since two orthogonal patterning schemes are used to form the non-volatile RAM bit cells 170. This may be contrasted to conventional lithography where a square feature may actually print as essentially circular non-volatile RAM bit cells 170.

In another embodiment, although the non-volatile RAM bit cells 170 are formed using since two orthogonal patterning schemes, the etch processing rounds the corners of each of the non-volatile RAM bit cells 170 to result in a near-square or square like, but not perfectly square, geometry. Referring to FIG. 3, an exemplary non-volatile RAM bit cells 397 demonstrates such a scenario. In one such embodiment, a plurality of non-volatile RAM bit cells 170 has a geometry as shown by the dark line in 397, where, from a plan view perspective, the non-volatile RAM bit cell has substantially straight edges along the first direction (y-direction) and along the second direction (x-direction). The non-volatile RAM bit cells has substantially rounded corners joining the straight edges.

Referring again to the recesses 162 described in association with FIGS. 1O, 2 and 3, in accordance with an embodiment of the present invention, the recesses 162 are formed between every column (or row) of the non-volatile RAM bit cells 170 of the array of non-volatile RAM bit cells. The recesses are patterned as such since the pattern of the recesses derives from a spacer mask that has already has a corresponding backbone removed, as described in association with FIG. 1F. In other embodiments, recesses are patterned as such since the pattern of the recesses derives from a spacer mask that has not yet had a corresponding backbone removed. In such cases, recesses may be formed that correspond to regions outside of a pair of spacers of a spacer mask (complementary areas) but not for regions inside of the pair of spacers of the spacer mask (backbone areas). As an example, FIG. 4 illustrates a cross-sectional view of an array of non-volatile random access memory (RAM) bit cells, in accordance with another embodiment of the present invention.

Figure 4:
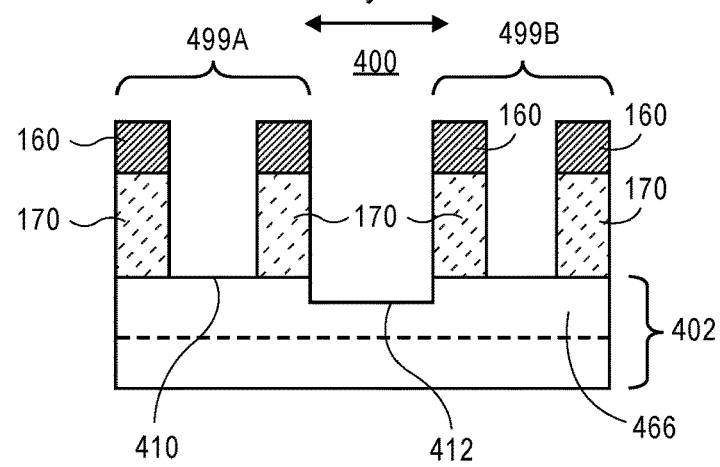
FIG. 4 illustrates a cross-sectional view of an array of non-volatile random access memory (RAM) bit cells, in accordance with another embodiment of the present invention.

Referring to FIG. 4, a structure 400 includes a first set 499A of non-volatile RAM bit cells 170 and a second set 499B of non-volatile RAM bit cells 170. The first set 499A of non-volatile RAM bit cells 170 has a region 410 between spacers that corresponds to the location of a backbone in a spacer-patterning processing scheme. The second set 499B of non-volatile RAM bit cells 170 also includes such a region. However, a recess 412 is formed between the adjacent spacers of the first set 499A of non-volatile RAM bit cells 170 and the second set 499B of non-volatile RAM bit cells 170. The recess 412 corresponds to a region that was not protected by a backbone when over-etching occurred, and therefore provides topography in an underlying top layer 466 of a substrate 402. Accordingly, in an embodiment, the semiconductor structure 400 further includes a recess 412 in the top layer 466 of the substrate 402, between non-volatile RAM bit cells of a first pairing of adjacent rows (right side of pairing 499A plus left side of pairing 499B) of the array of non-volatile RAM bit cells 170 along the second direction (x-direction), e.g., in a complementary location. However, a second pairing of adjacent rows (e.g., either pairing 499A or 499B) of the array of non-volatile RAM bit cells immediately adjacent the first pairing does not include an additional recess 412, e.g., region 410 is not recessed since it corresponds to a previous backbone location. Thus, in one embodiment, different from the recesses 162, the recesses 412 are formed between every other column (or every other row) of the non-volatile RAM bit cells 170 of an array of non-volatile RAM bit cells.

Referring again to FIG. 3, an exemplary embodiment is shown which includes both types of recesses 162 and 412. Using the central column (along the y-direction) of non-volatile RAM bit cells 170 of FIG. 3, recess 412 is formed in the central location, but not at outer locations 410 which represent locations corresponding to regions once protected by a backbone structure. Thus, in an embodiment, the semiconductor structure of FIG. 3 further includes an additional recess 412 in the top layer of the substrate, between non-volatile RAM bit cells of a pairing of adjacent rows of the array of non-volatile RAM bit cells along the second direction (x-direction), e.g., in a complementary location. However, backbone regions 410 do not include this type of recess.

It is to be appreciated that an array of RAM element 170 may be fabricated on an array of conductive interconnect formed in an inter-layer dielectric (ILD) layer. As an example, FIG. 5 illustrates a cross-sectional view of two RAM devices, in accordance with an embodiment of the present invention.

Figure 5:
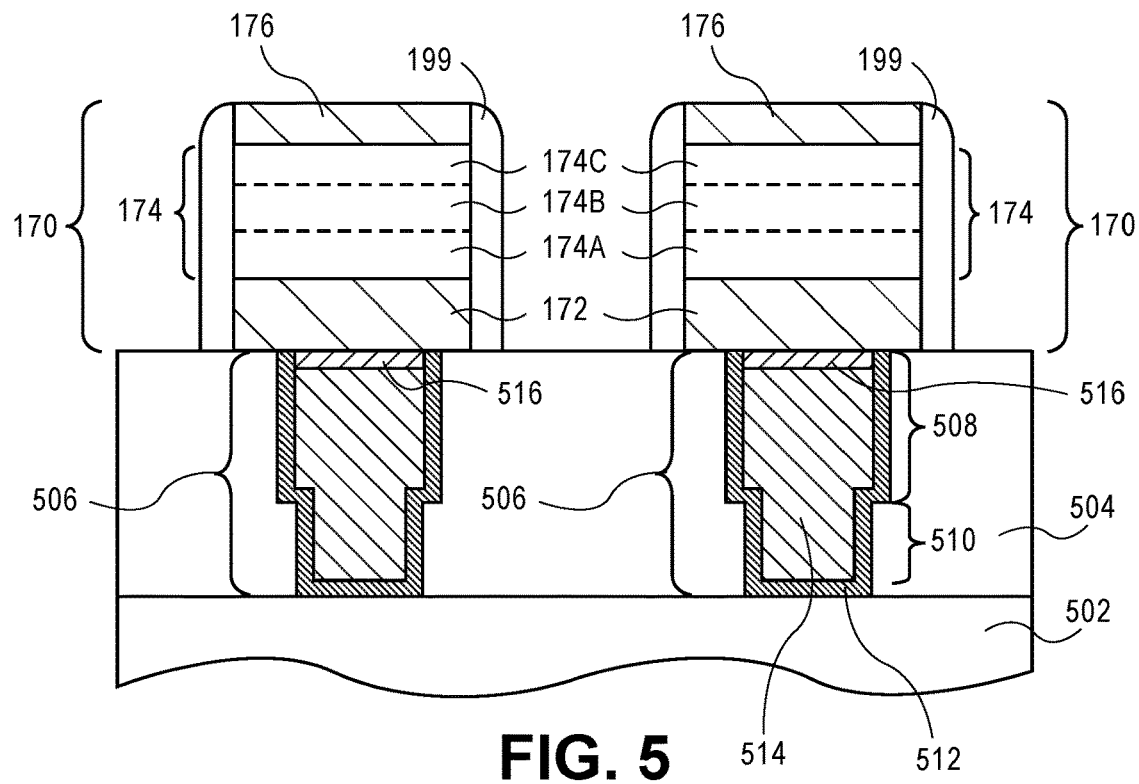
FIG. 5 illustrates a cross-sectional view of two RAM devices, in accordance with an embodiment of the present invention.

Referring to FIG. 5, each of the RAM devices includes a conductive interconnect 506 disposed in an inter-layer dielectric (ILD) layer 504 disposed above a substrate 502. The ILD layer 506 may have an uppermost surface substantially co-planar with an uppermost surface of the conductive interconnect 506. An RAM element 170 is disposed on each of the conductive interconnects 506. Each RAM element 170 may include a lower electrode 172, a switching layer (or stack of layers including a switching layer) 174, and an upper electrode 176, as is depicted in FIG. 5.

In an embodiment, the conductive interconnect 506 includes a conductive line portion 508 and an underlying via portion 510, as is depicted in FIG. 5. In another embodiment, the conductive interconnect is a conductive via. In one embodiment, the conductive interconnect includes a conductive fill material 514 surrounded by a barrier layer 512, which may include an upper barrier layer 516, as is depicted in FIG. 5. In a specific such embodiment, the conductive fill material 514 but not the barrier layer 512 is recessed to form an opening in which the upper barrier layer 516 is then formed. In an embodiment, although depicted using different shading, the upper barrier layer 516 is composed of substantially the same material as barrier layer. In one such embodiment, the material includes tantalum nitride.

In an embodiment, with reference to FIGS. 2 and 5, the RAM bit cell or element 170 is a spin torque transfer random access memory (STTRAM) bit cell or element. In one such embodiment, the switching layer (or stack of layers including a switching layer) 174 is a stack of layers 174A/174B/174C that is referred to as a magnetic tunnel junction (MTJ). In a specific such embodiment, the MTJ includes a fixed magnetic layer 174A, a tunneling barrier layer 174B, and a free magnetic layer 174C. In another specific such embodiment, the MTJ includes a free magnetic layer 174A, a tunneling barrier layer 174B, and a fixed magnetic layer 174C. The MTJ may utilize a phenomenon known as tunneling magnetoresistance (TMR).

For such a structure 174A/174B/174C including two ferromagnetic layers separated by a thin insulating tunnel layer, it is more likely that electrons will tunnel through the tunnel material layer when magnetizations of the two magnetic layers are in a parallel orientation than if they are not (non-parallel or antiparallel orientation). As such, the MTJ can be switched between two states of electrical resistance, one state having a low resistance and one state with a high resistance. The greater the differential in resistance, the higher the TMR ratio. The higher the TMR ratio, the more readily a bit can be reliably stored in association with the MTJ resistive state. MTJs with magnetic electrodes having a perpendicular (out of plane of substrate) magnetic easy axis have a potential for realizing higher density memory than in-plane variants, and may be referred to a pMTJ. In some embodiments, then, the MTJ is a perpendicular system, where spins of the magnetic layers are perpendicular to the plane of the material layers (e.g., the magnetic easy axis is in the z-direction out of the plane of substrate).

Referring to FIG. 5, fixed magnetic layer 174A (or 174C in the case that 174A is a free layer) may be composed of a material or stack of materials suitable for maintaining a fixed magnetization direction while a free magnetic material layer is magnetically softer (e.g., magnetization can easily rotate to parallel and antiparallel state with respect to fixed layer). In an embodiment, the fixed magnetic layer 174A (or 174C) is composed of a material or stack of materials suitable for maintaining a fixed majority spin. Thus, the fixed magnetic layer 174A (or 174C) may be referred to as a ferromagnetic layer. In one embodiment, the fixed magnetic layer 174A (or 174C) is composed of a single layer of cobalt iron boron (CoFeB). However, in another embodiment, the fixed magnetic layer 174A (or 174C) is composed of a cobalt iron boron (CoFeB) layer, ruthenium (Ru) layer, cobalt iron boron (CoFeB) layer stack. In an embodiment, although not depicted, a synthetic antiferromagnet (SAF) is disposed on or adjacent the fixed magnetic layer 174A (or 174C).

Referring again to FIG. 5, in an embodiment, the dielectric or tunneling layer 174B is composed of a material suitable for allowing current of a majority spin to pass through the layer, while impeding at least to some extent current of a minority spin to pass through the layer. Thus, the dielectric or tunneling layer 174B (or spin filter layer) may be referred to as a tunneling layer. In one embodiment, the dielectric layer is composed of a material such as, but not limited to, magnesium oxide (MgO) or aluminum oxide ($Al_2O_3$). In one embodiment, the dielectric layer has a thickness of approximately 1 nanometer.

Referring again to FIG. 5, in an embodiment, the free magnetic layer 174C (or 174A in the case that 174C is a fixed layer) is composed of a material suitable for transitioning between a majority spin and a minority spin, depending on the application. Thus, the free magnetic layer (or memory layer) may be referred to as a ferromagnetic memory layer. In one embodiment, the free magnetic layer is composed of a layer of cobalt iron (CoFe) or cobalt iron boron (CoFeB).

In an embodiment, the MTJ functions essentially as a resistor, where the resistance of an electrical path through the MTJ may exist in two resistive states, either "high" or "low," depending on the direction or orientation of magnetization in the free magnetic layer and in the fixed magnetic layer. In the case that the spin direction is of minority in the free magnetic layer, a high resistive state exists, where direction of magnetization in the free magnetic layer and the fixed magnetic layer are substantially opposed or anti-parallel with one another. In the case that the spin direction is of majority in the free magnetic layer, a low resistive state exists, where the direction of magnetization in the free magnetic layer and the fixed magnetic layer is substantially aligned or parallel with one another. It is to be appreciated that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

Thus, the MTJ may store a single bit of information ("0" or "1") by its state of magnetization. The information stored in the MTJ is sensed by driving a current through the MTJ. The free magnetic layer does not require power to retain its magnetic orientations. As such, the state of the MTJ is preserved when power to the device is removed. Therefore, a memory bit cell 170 is, in an embodiment, non-volatile. In accordance with an embodiment of the present invention, each bit of data is stored in a separate magnetic tunnel junction (MTJ). To write information in a STT-MRAM device, the spin transfer torque effect is used to switch the free layer from the parallel to anti-parallel state and vice versa. The passing of current through the MTJ produces spin polarized current, which results in a torque being applied to the magnetization of the free layer. When the spin polarized current is sufficiently strong, enough torque is applied to the free layer to cause its magnetic orientation to change, thus allowing for bits to be written. To read the stored bit, sensing circuitry measures the resistance of the MTJ.

Referring again to FIGS. 2 and 5, in an embodiment in which the RAM bit cell or element 170 is a spin torque transfer random access memory (STTRAM) bit cell or element, the lower electrode 172 includes a metal alloy layer, such as a titanium nitride (TiN) layer or a tantalum nitride (TaN) layer. In an embodiment, the upper electrode 176 is a topographically smooth electrode. In one such embodiment, upper top electrode 176 has a thickness suitable for good conductivity but has little to no columnar structure formation that would otherwise lead to a rough top surface. Such a topographically smooth electrode may be referred to as amorphous in structure. In a specific embodiment, the upper electrode 176 is composed of Ru layers interleaved with Ta layers. In alternative embodiments, however, the upper electrode 176 is a conventional single metal electrode, such as a Ta or Ru electrode.

In another embodiment, with reference to FIGS. 2 and 5, the RAM bit cell or element 170 is a resistive random access memory (RRAM) bit cell or element. Nonvolatile memory based on resistance change is known as RRAM. In an embodiment, the switching layer 174 is an anionic-based conductive oxide layer. In one such embodiment, one electrode (lower electrode 172 or upper electrode 176) in a memory element including the anionic-based conductive oxide layer 174 is a noble metal based electrode, while the other electrode (upper electrode 176 or lower electrode 172, respectively) is a transition metal for which some of the lower valence oxides are conductive (e.g., to act as an oxygen reservoir). That is, when oxygen atoms migrate to the transition metal oxide, the resulting interfacial transition metal oxide formed remains conductive. Examples of suitable transition metals which form conductive oxides include but are not limited to, W, V, Cr, or Ir. In an embodiment, examples of suitable noble metals include, but are not limited to Pd or Pt. In other embodiments, one or both of the electrodes 172 and 176 is fabricated from an electro-chromic material. In other embodiments, one or both of the electrodes 172 and 176 is fabricated from a second, different conductive oxide material.

In an embodiment, for an RRAM bit cell or element, examples of suitable conductive oxides for switching layer 174 include, but are not limited to $HfO_x$ or $TaO_x$. In another embodiment, the conductive oxide layer is composed of a material with two or more metal elements (e.g., as contrasted to common RRAM memories using one metal such as found in binary oxides, such as $HfO_x$ or $TaO_x$). For example, in an embodiment, the switching layer 174 includes a material such as, but not limited to, ITO ($In_2O_{3-x}SnO_{2-x}$), $In_2O_{3-x}$, sub-stoichiometric yttria doped zirconia ($Y_2O_{3-x}ZrO_{2-x}$), or $La_{1-x}Sr_xGa_{1-y}Mg_yO_{3-x-0.5(x+y)}$. In such ternary, quaternary, etc. alloys, the metals used are from adjacent columns of the periodic table. Specific examples of suitable such conductive oxides include, but are not limited to: Y and Zr in $Y_2O_{3-x}ZrO_{2-x}$, In and Sn in $In_2O_{3-x}SnO_{2-x}$, or Sr and La in $La_{1-x}Sr_xGa_{1-y}Mg_yO_3$. Such materials may be viewed as compositions selected to have aliovalent substitution to significantly increase the number of oxygen vacancies.

In an embodiment, with reference to FIGS. 2 and 5, the RAM bit cell or element 170 is a conductive bridge random access memory (CBRAM) bit cell or element. It is to be appreciated that CBRAM may be viewed as a specific type of resistive random access memory (RRAM). In a CBRAM device, a filament may be formed based on metallic migration into an electrolyte material which is the switching layer of the CBRAM device. By contrast, in conventional RRAM, a filament may be created based on oxygen vacancies.

In an embodiment, for a CBRAM) bit cell or element, the resistance switching layer 174 is composed of a solid electrolyte material. An electrolyte or solid electrolyte, as used herein, refers to solid electrolyte material which is a solid substance that receives ions, provides ions, or can transport ions. In an exemplary embodiment, the solid electrolyte material is a chalcogenide material. In another embodiment, the resistance switching layer 174 is composed of a metal oxide, such as hafnium oxide.

In an embodiment, in the case of a CBRAM bit cell or element, the lower electrode 172 (or, alternatively, the upper electrode 176) is an active electrode layer. The active electrode layer may be a source of cations for filament formation or resistance change in the switching layer 174. In an embodiment, the active electrode layer includes a metal species such as, but not limited to, copper, silver, nickel, or lithium. In an embodiment, the upper electrode 176 (or, alternatively, the lower electrode 172 in the case that the upper electrode 176 is an active electrode) is a passive electrode layer. The passive electrode layer may not be a source of cations for filament formation or resistance change in the switching layer 174. In an embodiment, the passive electrode layer includes a metal species such as, but not limited to, tungsten or platinum. In one embodiment, a metal nitride, such as a titanium nitride or a tantalum nitride layer, is used as the material for the passive electrode layer. In another embodiment, the passive electrode layer is composed of a noble metal such as, but not limited to Pd or Pt.

As described in association with FIG. 1O, in an embodiment, the materials of the RAM bit cell or elements 170 are patterned using a subtractive etching process. As depicted in FIG. 5, in an embodiment, a dielectric sidewall spacer 199 is formed laterally adjacent to and in contact with sidewalls of the patterned material layers of the RAM bit cell or elements 170. In one embodiment, the dielectric sidewall spacer 199 is formed using a conformal deposition of a dielectric material, such as a silicon nitride layer, and subsequent anisotropic etching to form the dielectric sidewall spacer 199.

Referring again to FIG. 5, and as used throughout the present disclosure, in an embodiment, one or more interlayer dielectrics (ILDs), such as ILD layer 504, are included in an RAM device structure. Such ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. In cases where a stack of ILD layers is implemented, etch stop materials may be included as intervening dielectric layers between the ILD layers. Such etch stop layers may be composed of dielectric materials different from the interlayer dielectric material. In some embodiments, an etch stop layer includes a layer of a nitride of silicon (e.g., silicon nitride) or a layer of an oxide of silicon, or both, or a combination thereof. Other suitable materials may include carbon-based materials, such as silicon carbide. Alternatively, other etch stop layers known in the art may be used depending upon the particular implementation. The etch stop layers may be formed by CVD, PVD, or by other deposition methods.

Referring again to FIG. 5, and as used throughout the present disclosure, in an embodiment, the metal lines (such as 508) and vias (such as 510) are composed of one or more metal or other conductive structures. A common example is the use of copper lines and structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

Referring again to FIG. 5, and as used throughout the present disclosure, in an embodiment, substrate 502 is a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

Thus, it is to be appreciated that the layers and materials described in association with FIGS. 1A-1O, FIG. 2, FIG. 3, FIG. 4 or FIG. 5, and as used throughout the present disclosure, are typically formed on or above an underlying semiconductor substrate or structure, such as underlying device layer(s) of an integrated circuit. In an embodiment, an underlying semiconductor substrate 102, 402 or 502 represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. In one embodiment, the illustrated structure depicted in FIGS. 1A-1O, FIG. 2, FIG. 3, FIG. 4 or FIG. 5 is fabricated on underlying transistor or other semiconductor device layer(s) formed in or above the substrate 102, 402 or 502. In another embodiment, the illustrated structures depicted in FIGS. 1A-1O, FIG. 2, FIG. 3, FIG. 4 or FIG. 5 are fabricated on underlying lower level interconnect layers formed above the substrate 102, 402 or 502, respectively.

In another aspect, a conductive interconnect of an associated RAM element stack may be coupled to a drain region of an underlying select transistor disposed on a substrate. As an example, FIG. 6 illustrates a cross-sectional view of a random access memory (RAM) element coupled to a drain side of a transistor selector, in accordance with an embodiment of the present invention.

Figure 6:
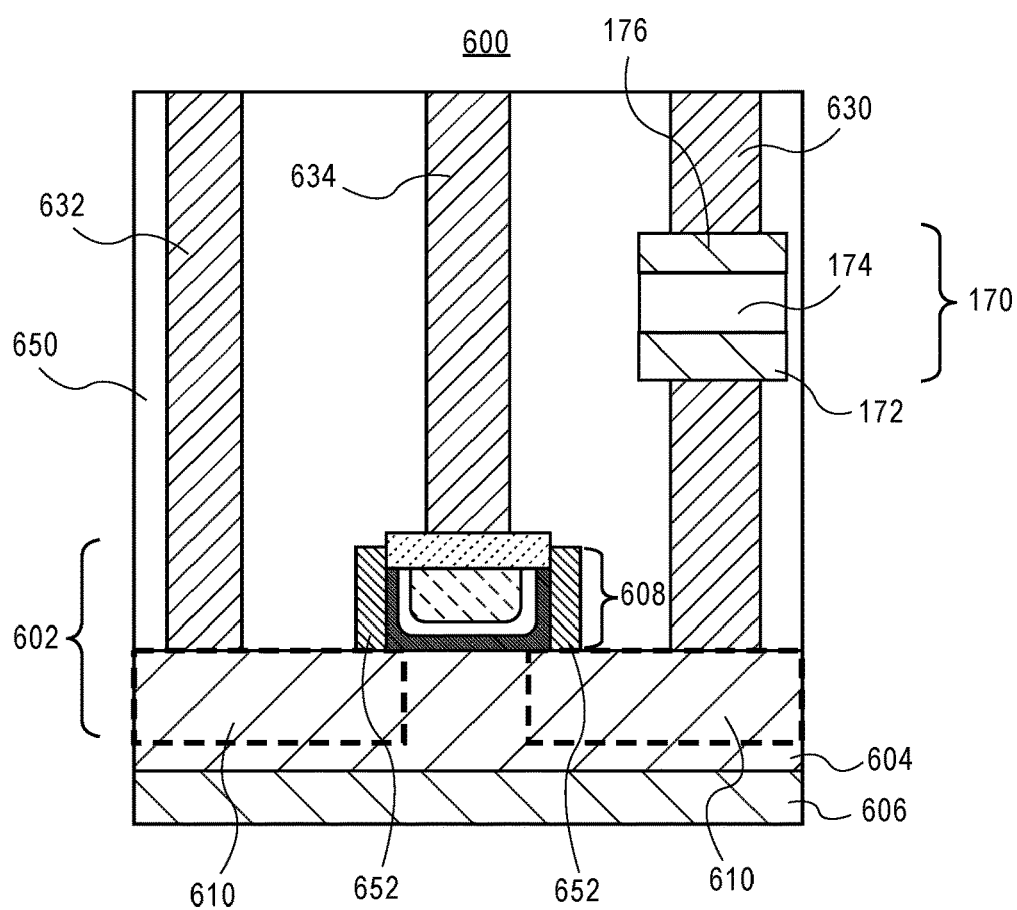
FIG. 6 illustrates a cross-sectional view of a random access memory (RAM) element coupled to a drain side of a transistor selector, in accordance with an embodiment of the present invention.

Referring to FIG. 6, a memory structure 600 includes a transistor 602 disposed in or above an active region 604 of a semiconductor substrate 606. The transistor 602 includes a gate electrode 608 with source/drain regions 610 on either side of the gate electrode 608, and in active region 604 of substrate 606. In an embodiment, the source/drain region 610 on the left-hand side of FIG. 6 is a source region, and the source/drain region 610 on the right-hand side of FIG. 6 is a drain region. An RAM element 170 is coupled to the drain region of the transistor 602, but not to the source region of the transistor 602. The arrangement enables driving of the RAM element 170 by the drain side only. The RAM element 170 and portions of the transistor 602 may be included in an inter-layer dielectric (ILD) layer 650, as is depicted in FIG. 6.

The RAM element 170 of FIG. 6 includes a lower electrode 172, a switching layer (or stack of layers including a switching layer) 174, and an upper electrode 176. In an embodiment, the RAM element 170 is, in an embodiment, included as an interrupting feature along a conductive drain contact 630, as is depicted. In one such embodiment, corresponding gate contact 634 and source contact 632 are not coupled to, or interrupted by the RAM element 170, as is depicted in FIG. 6. It is to be appreciated that although the RAM element 170 is shown generically along the drain contact 630 without a lateral reference, the actual layer in which the RAM element 170 is included may be viewed as an interconnect layer (e.g., M1, M2, M3, M4, etc.) corresponding to a logic region in another area of the substrate 606. It is also to be appreciated that additional interconnect layer(s) may be formed on top of the structure 600 shown in FIG. 6, e.g., using standard dual damascene process techniques that are well-known in the art.

In an embodiment, transistor 602 is a metal-oxide-semiconductor field-effect transistor (MOSFET or simply MOS transistor), fabricated on a substrate. In various implementations of the invention, the MOS transistors described herein may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer of each MOS transistor is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers 652 may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

To provide further context, integrating memory directly onto a microprocessor chip would be advantageous since it enables higher operation speeds compared to having physically separate logic and memory chips. Unfortunately, traditional charge-based memory technologies such as DRAM and NAND Flash are now facing severe scalability issues related to increasingly precise charge placement and sensing requirements. As such, embedding charge-based memory directly onto a high performance logic chip is not very attractive for future technology nodes. However, a memory technology that does have the potential to scale to much smaller geometries compared to traditional charge-based memories includes one of STTRAM, RRAM, or CBRAM, since it relies on magnetic state or on resistivity rather than charge as the information carrier. However, in order to exploit the potential benefits of a high performance logic chip with embedded STTRAM memory, RRAM memory, or CBRAM memory, an appropriate integrated logic plus RAM structure and fabrication method is needed. Embodiments of the present invention include such structures and fabrication processes.

Relating to one or more embodiments described herein, it is to be appreciated that traditional DRAM memory is facing severe scaling issues and, so, other types of memory devices are being actively explored in the electronics industry. Future contenders include STTRAM devices, RRAM devices, or CBRAM devices. Embodiments described herein include a fabrication method for embedding such RAM bit cell arrays into a logic process technology. Embodiments described may be advantageous for processing schemes involving the fabrication of logic processors with embedded memory arrays.

In another aspect, an RAM element may be included in an integrated circuit in regions typically referred to as back end or back end of line (BEOL) layers of the integrated circuit. As examples, FIGS. 7A-7E illustrate schematic views of several options for positioning an RAM element in an integrated circuit, in accordance with embodiments of the present invention.

Referring to all FIGS. 7A-7E, in each case, a memory region 700 and a logic region 702 of an integrated circuit are depicted schematically. Each memory region 700 includes a select transistor 704 and overlying alternating metal lines and vias. Each logic region includes a plurality of transistors 706 and overlying alternating metal lines and vias which can be used to connect the plurality of transistors 706 into functional circuits, as is well known in the art. Each of the RAM devices 720, 730, 740, 750 or 760 may be a device such as described above for RAM memory element 170, which includes a lower electrode 172, a switching layer 174 (or stack of layers including a switching layer), and an upper electrode 176, as described in association with FIGS. 2 and 5. In an embodiment, each RAM device is an STTRAM device, an RRAM device, or a CBRAM device.

Figure 7:
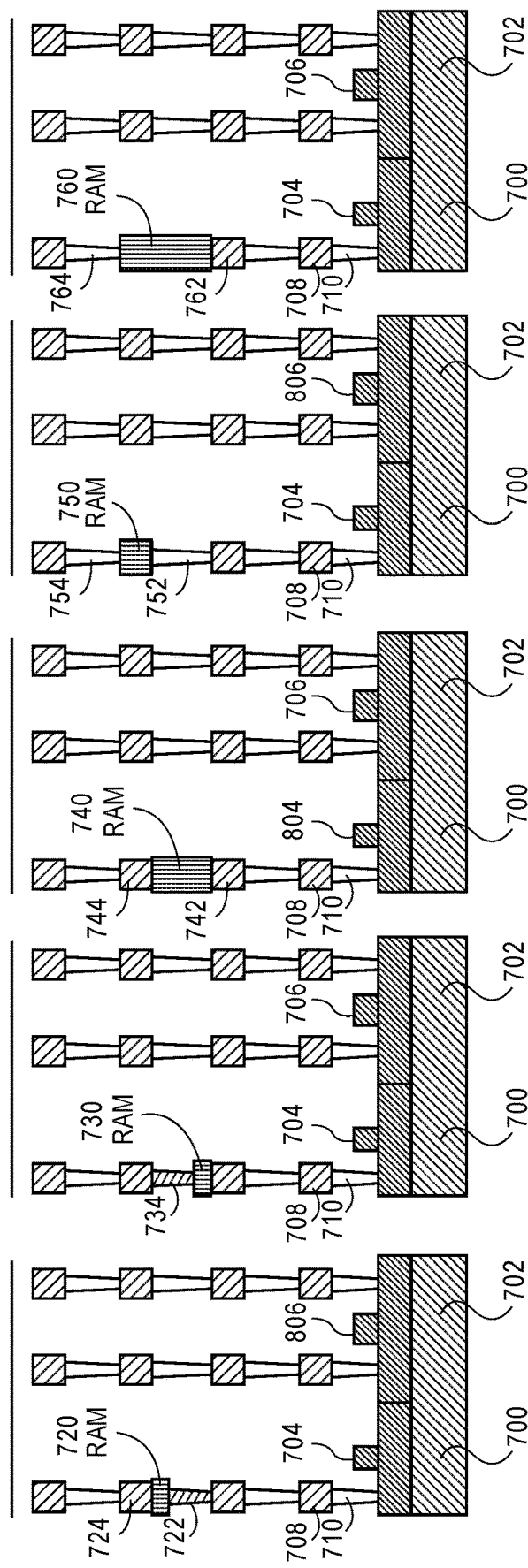
FIGS. 7A-7E illustrate schematic views of several options for positioning an RAM element in an integrated circuit, in accordance with embodiments of the present invention.

Referring to FIG. 7A, an RAM device 720 is disposed between a lower conductive via 722 and an upper conductive line 724. In one embodiment, the lower conductive via 722 is in electrical contact with a lower electrode of the RAM device 720, and the upper conductive line 724 is in electrical contact with an upper electrode of the RAM device 720. In a specific embodiment, the lower conductive via 722 is in direct contact with a lower electrode of the RAM device 720, and the upper conductive line 724 is in direct contact with an upper electrode of the RAM device 720.

Referring to FIG. 7B, an RAM device 730 is disposed between a lower conductive line 732 and an upper conductive via 734. In one embodiment, the lower conductive line 732 is in electrical contact with a lower electrode of the RAM device 730, and the upper conductive via 734 is in electrical contact with an upper electrode of the RAM device 730. In a specific embodiment, the lower conductive line 732 is in direct contact with a lower electrode of the RAM device 730, and the upper conductive via 834 is in direct contact with an upper electrode of the RAM device 730.

Referring to FIG. 7C, an RAM device 740 is disposed between a lower conductive line 742 and an upper conductive line 744 without an intervening conductive via. In one embodiment, the lower conductive line 742 is in electrical contact with a lower electrode of the RAM device 740, and the upper conductive line 744 is in electrical contact with an upper electrode of the RAM device 740. In a specific embodiment, the lower conductive line 742 is in direct contact with a lower electrode of the RAM device 740, and the upper conductive line 744 is in direct contact with an upper electrode of the RAM device 740.

Referring to FIG. 7D, an RAM device 750 is disposed between a lower conductive via 752 and an upper conductive via 754 without an intervening conductive line. In one embodiment, the lower conductive via 752 is in electrical contact with a lower electrode of the RAM device 750, and the upper conductive via 754 is in electrical contact with an upper electrode of the RAM device 750. In a specific embodiment, the lower conductive via 752 is in direct contact with a bottom electrode of the RAM device 750, and the upper conductive via 754 is in direct contact with an upper electrode of the RAM device 750.

Referring to FIG. 7E, an RAM device 760 is disposed between a lower conductive line 762 and an upper conductive via 764 in place of an intervening conductive line and conductive via pairing. In one embodiment, the lower conductive line 762 is in electrical contact with a bottom electrode of the RAM device 760, and the upper conductive via 764 is in electrical contact with a lower electrode of the RAM device 760. In a specific embodiment, the lower conductive line 762 is in direct contact with a lower electrode of the RAM device 760, and the upper conductive via 764 is in direct contact with an upper electrode of the RAM device 760.

Figure 8:
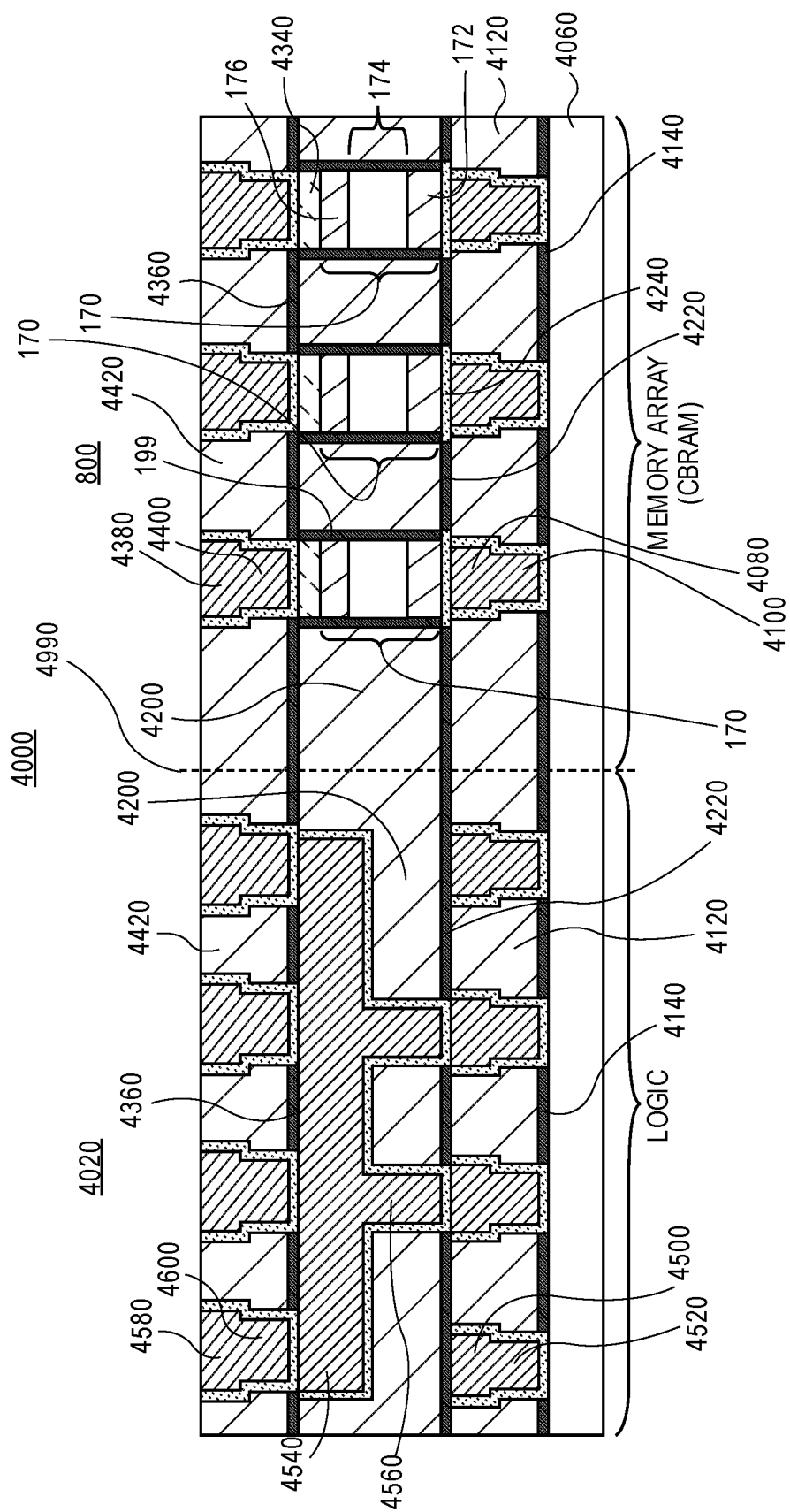
FIG. 8 illustrates a cross-sectional view of a logic region together with a random access memory (RAM) memory array integrated on a common substrate, in accordance with an embodiment of the present invention.

An RAM array may be embedded in a logic chip. As an example, FIG. 8 illustrates a cross-sectional view of a logic region together with a random access memory (RAM) memory array integrated on a common substrate, in accordance with an embodiment of the present invention. Referring to FIG. 8, a structure 4000 includes a logic region 4020 and an RAM array region 4040.

Referring to the RAM array region 4040 of FIG. 8, in a first layer, metal 2 (M2) 4080 and via 1 (V1) 4100 structures are formed above a substrate 4060. The M2 4080 and V1 4100 structures are formed in an inter-layer dielectric layer 4120 disposed over an etch stop layer 4140.

Referring again to the RAM array region 4040 of FIG. 8, in a second layer, a plurality of RAM stacks 170 is formed in the inter-layer dielectric layer 4200 disposed over the etch stop layer 4220. The plurality of RAM stacks 170 may be coupled to corresponding ones of the M2 4080 structures by a conductive layer 4240, as is depicted in FIG. 8. A dielectric spacer layer 199 may be formed on sidewalls of portions of the RAM stacks, as is also depicted in FIG. 8. Each of the RAM stacks 170 includes a lower electrode 172, a switching layer 174 (or stack of layers including a switching layer), and an upper electrode 176. It is to be appreciated that each RAM stack 170 may include one of combinations of material layers of RAM element 170 described in association with FIGS. 2 and 5. In an embodiment, the RAM stack 170 is an STTRAM stack, an RRAM stack, or a CBRAM stack. In an embodiment, a top electrode or conductive hardmask 4340 may also be included, as is depicted in FIG. 8.

Referring again to the RAM array region 4040 of FIG. 8, in a third layer, an etch stop layer 4360 is disposed on the inter-layer dielectric layer 4200. Metal 4 (M4) 4380 and via to memory 4400 structures are formed in the inter-layer dielectric layer 4420 disposed over the etch stop layer 4360. It is to be appreciated that additional interconnect layer(s) may be formed on top of the M4/via to memory layers of the RAM array region 4040 of FIG. 8, e.g., using standard dual damascene process techniques that are well-known in the art.

It is to be appreciated that although the RAM stacks may actually include numerous layers of very thin films, for the sake of simplicity the RAM stacks 170 are depicted as describe above. It is also to be appreciated that although in the illustrations the RAM stacks are shown embedded into a corresponding logic metal 3 (M3) layer, they may instead be embedded into some other interconnect layer (e.g., M1, M2, M4, etc.)

Referring again to FIG. 8, in an embodiment, the conductive metal layer 4240 is a tantalum nitride (TaN) layer. In one embodiment, the conductive metal layer 4240 is referred to as a "thin via" layer. In an embodiment, the top electrode 4340 is composed of a material or stack of materials suitable for electrically contacting the RAM stack 170. In an embodiment, the top electrode 4340 is a topographically smooth electrode. In one such embodiment, the top electrode 4340 has a thickness suitable for good conductivity but has little to no columnar structure formation that would otherwise lead to a rough top surface. Such a topographically smooth electrode may be referred to as amorphous in structure. In an embodiment, the top electrode 4340 begins as a hardmask layer, such as a titanium nitride hardmask layer, used for patterning the RAM stack and is ultimately retained as a conductive contact.

Referring now to the logic region 4020 of FIG. 8, in the first layer, metal 2 (M2) 4500 and via 1 (V1) 4520 structures are formed in the inter-layer dielectric layer 4120 disposed over the etch stop layer 4140. In the second layer, the etch stop layer 4220 is disposed on the inter-layer dielectric layer 4120. Metal 3 (M3) 4540 and via 2 (V2) 4560 structures are formed in the inter-layer dielectric layer 4200 disposed over the etch stop layer 4220. In the third layer, the etch stop layer 4360 is disposed on the inter-layer dielectric layer 4200. Metal 4 (M4) 4580 and via 3 (V3) 4600 structures are formed in the inter-layer dielectric layer 4420 disposed over the etch stop layer 4360. It is to be appreciated that additional interconnect layer(s) may be formed on top of the M4/V3 layers of the logic region 4020 of FIG. 8, e.g., using standard dual damascene process techniques that are well-known in the art.

Figure 9:
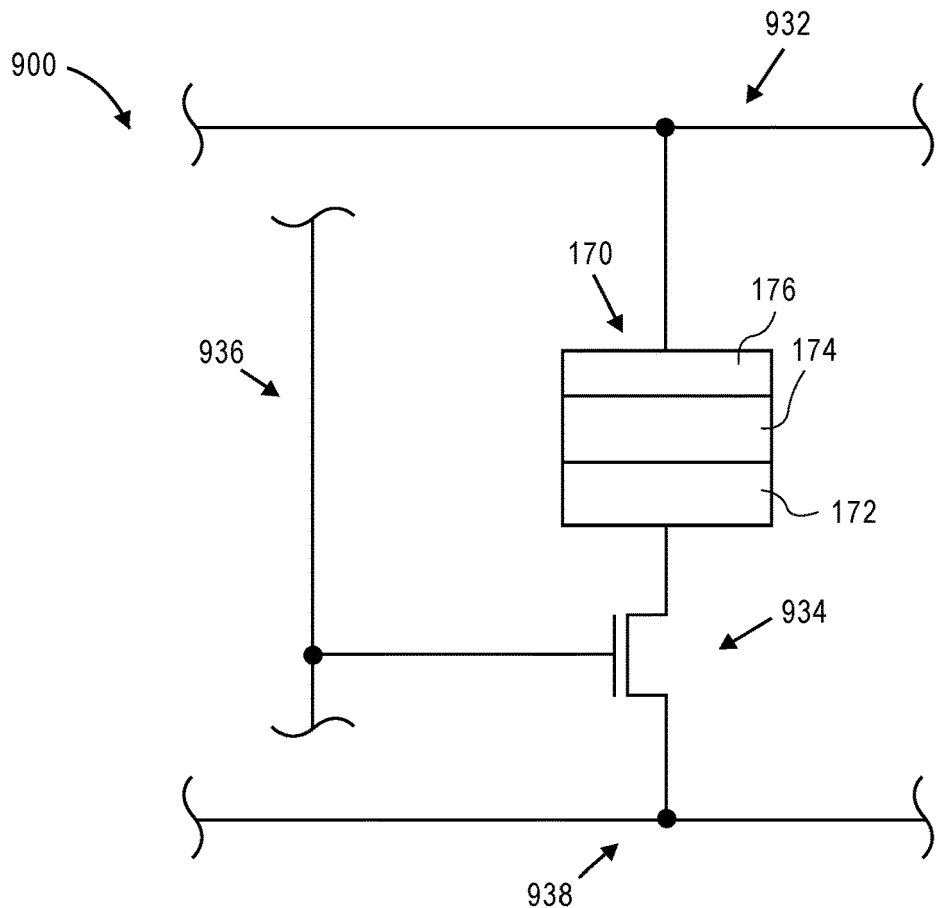
FIG. 9 illustrates a schematic of a memory bit cell which includes an RAM memory element, in accordance with an embodiment of the present invention.

It is to be appreciated that an RAM material stack may be used to fabricate a memory bit cell. For example, FIG. 9 illustrates a schematic of a memory bit cell 900 which includes a random access memory (RAM) memory element 170, in accordance with an embodiment of the present invention. Such an RAM memory element may be suitable for manufacture on a substrate in common with logic regions of the substrate.

Referring to FIG. 9, the RAM memory element 170 includes a lower electrode 172 with a switching layer 174 (or stack of layers including a switching layer) above the lower electrode 172. An upper electrode 176 is above the switching layer 174 (or stack of layers including a switching layer). It is to be appreciated that the RAM element 170 may include the material layers described in association with RAM element 170 described in association with FIGS. 2 and 5. In an embodiment, the RAM memory element 170 is an STTRAM element, an RRAM element, or a CBRAM element.

The upper electrode 176 may be electrically connected to a bit line 932. The lower electrode 172 may be coupled with a transistor 934. The transistor 934 may be coupled with a wordline 936 and a source line 938 in a manner that will be appreciated by those skilled in the art. The memory bit cell 900 may further include additional read and write circuitry (not shown), a sense amplifier (not shown), a bit line reference (not shown), and the like, as will be appreciated by those skilled in the art, for the operation of the memory bit cell 900. It is to be appreciated that a plurality of the memory bit cells 900 may be operably connected to one another to form a memory array, where the memory array can be incorporated into a non-volatile memory region of a substrate in common with a logic region. It is to be appreciated that the transistor 934 may be connected to the upper electrode 176 or the lower electrode 172, although only the latter is shown. Likewise, bit line 932 may be connected to the lower electrode 172 or the upper electrode 176, although only the latter is shown.

Figure 10:
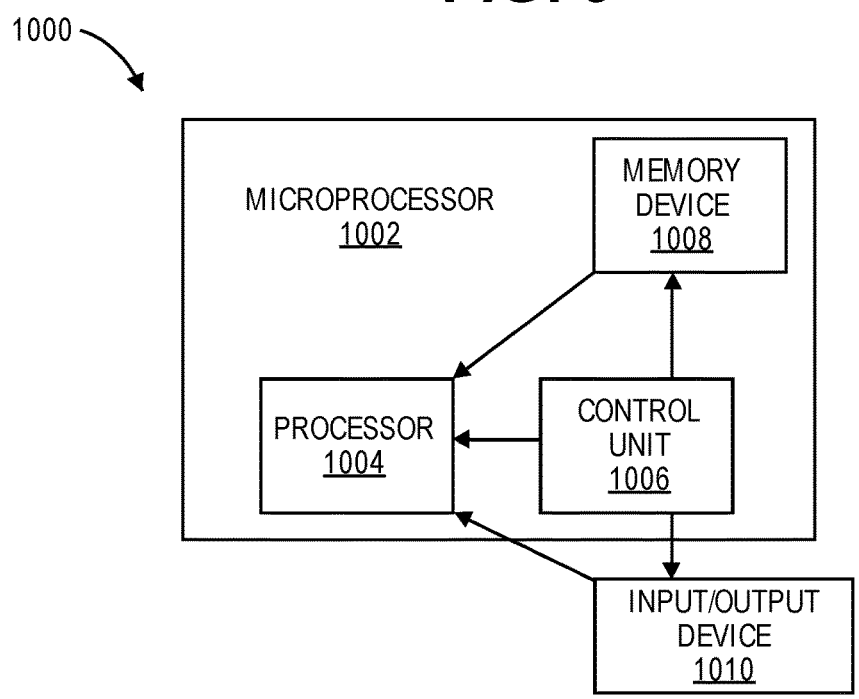
FIG. 10 illustrates a block diagram of an electronic system, in accordance with an embodiment of the present invention.

FIG. 10 illustrates a block diagram of an electronic system 1000, in accordance with an embodiment of the present invention. The electronic system 1000 can correspond to, for example, a portable system, a computer system, a process control system, or any other system that utilizes a processor and an associated memory. The electronic system 1000 may include a microprocessor 1002 (having a processor 1004 and control unit 1006), a memory device 1008, and an input/output device 1010 (it is to be appreciated that the electronic system 1000 may have a plurality of processors, control units, memory device units and/or input/output devices in various embodiments). In one embodiment, the electronic system 1000 has a set of instructions that define operations which are to be performed on data by the processor 1004, as well as, other transactions between the processor 1004, the memory device 1008, and the input/output device 1010. The control unit 1006 coordinates the operations of the processor 1004, the memory device 1008 and the input/output device 1010 by cycling through a set of operations that cause instructions to be retrieved from the memory device 1008 and executed. The memory device 1008 can include a memory element as described in the present description. In an embodiment, the memory device 1008 is embedded in the microprocessor 1002, as depicted in FIG. 10. In an embodiment, the processor 1004, or another component of electronic system 1000, includes an array of random access memory (RAM) devices, such as those described herein.

Figure 11:
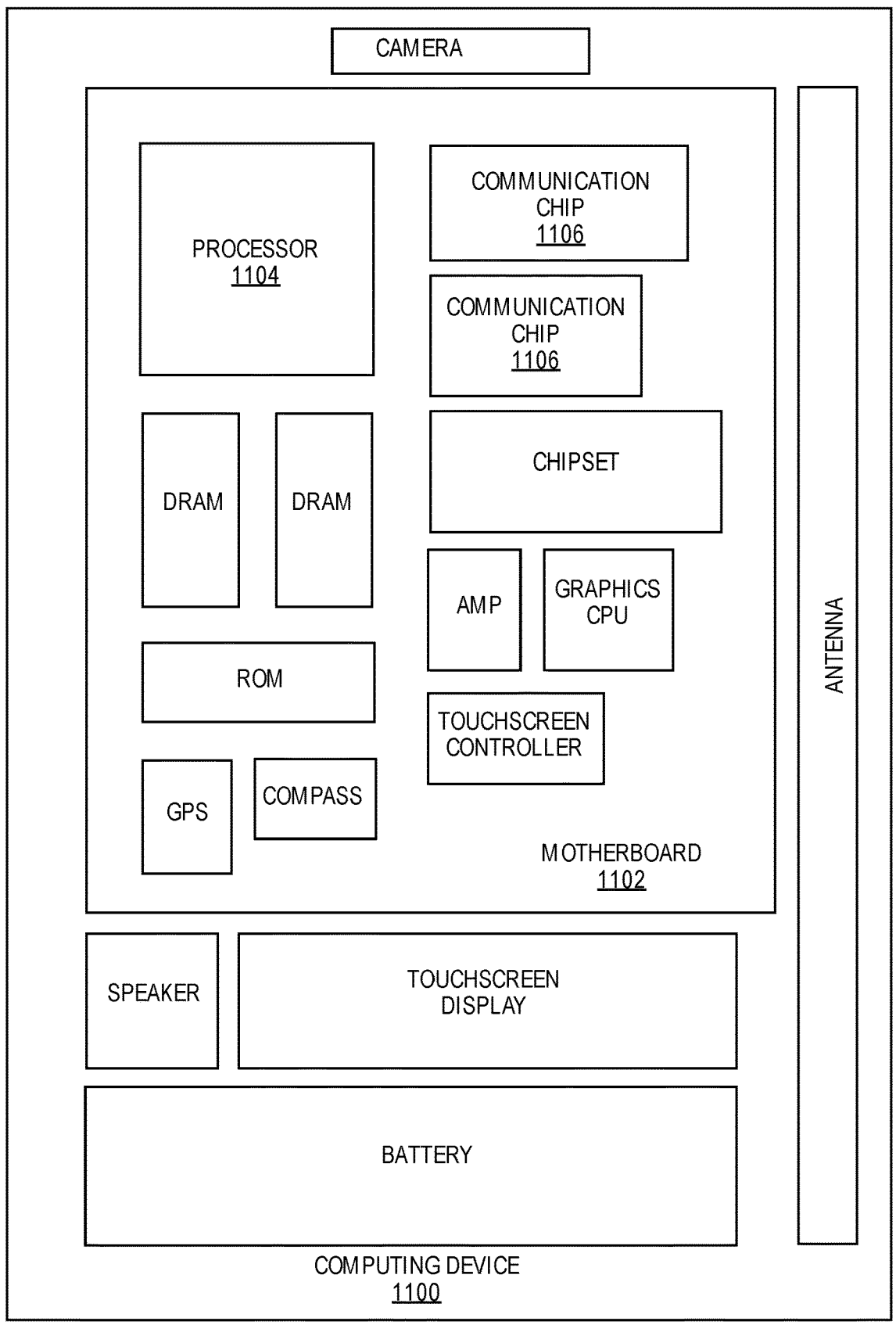
FIG. 11 illustrates a computing device in accordance with one embodiment of the invention.

FIG. 11 illustrates a computing device 1100 in accordance with one embodiment of the invention. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of embodiments of the invention, the integrated circuit die of the processor includes one or more arrays, such as random access memory (RAM) bit cells fabricated using spacer-based patterning, built in accordance with embodiments of the present invention. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of an embodiment of the invention, the integrated circuit die of the communication chip includes random access memory (RAM) bit cells fabricated using spacer-based patterning, built in accordance with embodiments of the present invention.

In further implementations, another component housed within the computing device 1100 may contain a stand-alone integrated circuit memory die that includes one or more arrays, such as random access memory (RAM) bit cells fabricated using spacer-based patterning, built in accordance with embodiments of the present invention.

In various implementations, the computing device 1100 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Accordingly, one or more embodiments of the present invention relate generally to the fabrication of embedded microelectronic memory. The microelectronic memory may be non-volatile, where the memory can retain stored information even when not powered. One or more embodiments of the present invention relate to the fabrication of spin torque transfer random access memory (STTRAM), resistive random access memory (RRAM), or conductive bridge random access memory (CBRAM) memory arrays integrated into a logic processor. Such arrays may be used in an embedded non-volatile memory, either for its non-volatility, or as a replacement for embedded dynamic random access memory (eDRAM). For example, such an array may be used for 1T-1X memory or 2T-1X memory (X=magneto-based switching device or resistor-based switching device) at competitive cell sizes within a given technology node.

Figure 12:
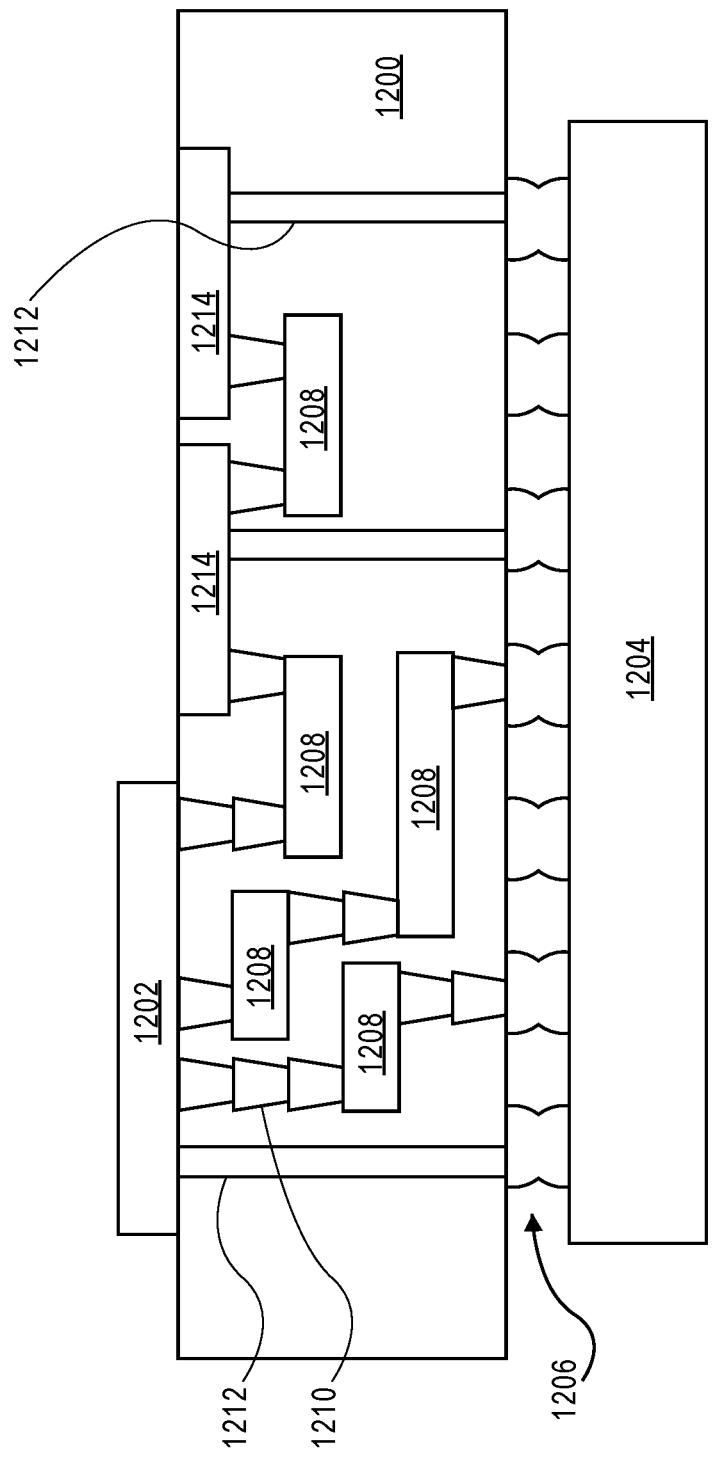
FIG. 12 illustrates an interposer that includes one or more embodiments of the invention.

FIG. 12 illustrates an interposer 1200 that includes one or more embodiments of the invention. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the invention, apparatuses or processes disclosed herein may be used in the fabrication of interposer 1200.

Thus, embodiments of the present invention include spacer-based patterning for tight-pitch and low-variability random access memory (RAM) bit cells, and the resulting structures.

Example embodiment 1: A semiconductor structure includes a substrate having a top layer. An array of non-volatile random access memory (RAM) bit cells is disposed on the top layer of the substrate. The array of non-volatile RAM bit cells includes columns of non-volatile RAM bit cells along a first direction and rows of non-volatile RAM bit cells along a second direction orthogonal to the first direction. A plurality of recesses is in the top layer of the substrate, along the first direction between columns of the array of non-volatile RAM bit cells.

Example embodiment 2: The semiconductor structure of example embodiment 1, wherein the array of non-volatile RAM bit cells has a pitch along the first direction and has the pitch along the second direction.

Example embodiment 3: The semiconductor structure of example embodiment 1 or 2, further including an additional recess in the top layer of the substrate, between non-volatile RAM bit cells of a first pairing of adjacent rows of the array of non-volatile RAM bit cells along the second direction.

Example embodiment 4: The semiconductor structure of example embodiment 1, 2 or 3, wherein a second pairing of adjacent rows of the array of non-volatile RAM bit cells immediately adjacent the first pairing does not include an additional recess in the top layer of the substrate between non-volatile RAM bit cells of the second pairing.

Example embodiment 5: The semiconductor structure of example embodiment 1, 2, 3 or 4, wherein each of the non-volatile RAM bit cells of the array of non-volatile RAM bit cells has, from a plan view perspective, substantially straight edges along the first direction and along the second direction and substantially rounded corners joining the straight edges.

Example embodiment 6: The semiconductor structure of example embodiment 1, 2, 3, 4 or 5, wherein the array of non-volatile RAM bit cells is an array of spin torque transfer random access memory (STTRAM) bit cells.

Example embodiment 7: The semiconductor structure of example embodiment 1, 2, 3, 4 or 5, wherein the array of non-volatile RAM bit cells is an array of resistive random access memory (RRAM) bit cells.

Example embodiment 8: The semiconductor structure of example embodiment 1, 2, 3, 4 or 5, wherein the array of non-volatile RAM bit cells is an array of conductive bridge random access memory (CBRAM) bit cells.

Example embodiment 9: A semiconductor structure includes a substrate having a top layer. An array of non-volatile random access memory (RAM) bit cells is disposed on the top layer of the substrate. The array of non-volatile RAM bit cells includes columns of non-volatile RAM bit cells along a first direction and rows of non-volatile RAM bit cells along a second direction orthogonal to the first direction. Each of the non-volatile RAM bit cells of the array of non-volatile RAM bit cells has, from a plan view perspective, substantially straight edges along the first direction and along the second direction and substantially rounded corners joining the straight edges.

Example embodiment 10: The semiconductor structure of example embodiment 9, wherein the array of non-volatile RAM bit cells has a pitch along the first direction and has the pitch along the second direction.

Example embodiment 11: The semiconductor structure of example embodiment 9 or 10, further including a recess in the top layer of the substrate, between non-volatile RAM bit cells of a first pairing of adjacent rows of the array of non-volatile RAM bit cells along the second direction. A second pairing of adjacent rows of the array of non-volatile RAM bit cells immediately adjacent the first pairing does not include a recess in the top layer of the substrate between non-volatile RAM bit cells of the second pairing.

Example embodiment 12: The semiconductor structure of example embodiment 9, 10 or 11, wherein the array of non-volatile RAM bit cells is an array of spin torque transfer random access memory (STTRAM) bit cells.

Example embodiment 13: The semiconductor structure of example embodiment 9, 10 or 11, wherein the array of non-volatile RAM bit cells is an array of resistive random access memory (RRAM) bit cells.

Example embodiment 14: The semiconductor structure of example embodiment 9, 10 or 11, wherein the array of non-volatile RAM bit cells is an array of conductive bridge random access memory (CBRAM) bit cells.

Example embodiment 15: A method of fabricating a semiconductor structure includes forming a hardmask layer above a memory material stack on a top layer of a substrate. The method also includes forming a grating structure in the hardmask layer using a first spacer-based patterning process, the grating structure including a plurality of lines along a first direction. The method also includes cutting the plurality of lines along a second direction orthogonal to the first direction using a second spacer-based patterning process to form a twice-patterned hardmask. The method also includes etching the memory material stack using the twice-patterned hardmask as a mask to form an array of non-volatile random access memory (RAM) bit cells from the memory material stack. The array of non-volatile RAM bit cells includes columns of non-volatile RAM bit cells along the first direction and rows of non-volatile RAM bit cells along the second direction. The etching forms a plurality of recesses in the top layer of the substrate, along the first direction between columns of the array of non-volatile RAM bit cells.

Example embodiment 16: The method of example embodiment 15, wherein the array of non-volatile RAM bit cells has a pitch along the first direction and has the pitch along the second direction.

Example embodiment 17: The method of example embodiment 15 or 16, wherein the first spacer-based patterning process is a first pitch halving pitch division processing scheme, and wherein the second spacer-based patterning process is a second pitch halving pitch division processing scheme.

Example embodiment 18: The method of example embodiment 15, 16 or 17, wherein the etching further forms an additional recess in the top layer of the substrate, between non-volatile RAM bit cells of a first pairing of adjacent rows of the array of non-volatile RAM bit cells along the first direction.

Example embodiment 19: The method of example embodiment 15, 16, 17 or 18, wherein the etching does not form an additional recess in the top layer of the substrate between non-volatile RAM bit cells of the second pairing.

Example embodiment 20: The method of example embodiment 15, 16, 17, 18 or 19, wherein the etching forms, from a plan view perspective, substantially straight edges along the first direction and along the second direction and substantially rounded corners joining the straight edges for each of the non-volatile RAM bit cells of the array of non-volatile RAM bit cells.

Example embodiment 21: The method of example embodiment 15, 16, 17, 18, 19 or 20, wherein forming the array of non-volatile RAM bit cells includes forming an array of spin torque transfer random access memory (STTRAM) bit cells, an array of resistive random access memory (RRAM) bit cells, or an array of conductive bridge random access memory (CBRAM) bit cells.

Example embodiment 22: A method of fabricating a semiconductor structure includes forming a hardmask layer above a memory material stack on a top layer of a substrate. The method also includes forming a grating structure in the hardmask layer using a first spacer-based patterning process, the grating structure including a plurality of lines along a first direction. The method also includes cutting the plurality of lines along a second direction orthogonal to the first direction using a second spacer-based patterning process to form a twice-patterned hardmask. The method also includes etching the memory material stack using the twice-patterned hardmask as a mask to form an array of non-volatile random access memory (RAM) bit cells from the memory material stack. The array of non-volatile RAM bit cells includes columns of non-volatile RAM bit cells along the first direction and rows of non-volatile RAM bit cells along the second direction. The etching forms, from a plan view perspective, substantially straight edges along the first direction and along the second direction and substantially rounded corners joining the straight edges for each of the non-volatile RAM bit cells of the array of non-volatile RAM bit cells.

Example embodiment 23: The method of example embodiment 22, wherein the array of non-volatile RAM bit cells has a pitch along the first direction and has the pitch along the second direction.

Example embodiment 24: The method of example embodiment 22 or 23, wherein the first spacer-based patterning process is a first pitch halving pitch division processing scheme, and wherein the second spacer-based patterning process is a second pitch halving pitch division processing scheme.

Example embodiment 25: The method of example embodiment 22, 23 or 24, wherein forming the array of non-volatile RAM bit cells includes forming an array of spin torque transfer random access memory (STTRAM) bit cells, an array of resistive random access memory (RRAM) bit cells, or an array of conductive bridge random access memory (CBRAM) bit cells.

What is claimed is:

1. A semiconductor structure, comprising:
a substrate having a top dielectric layer;
an array of non-volatile random access memory (RAM) bit cells disposed directly on and in contact with the top dielectric layer of the substrate, the array of non-volatile RAM bit cells comprising columns of non-volatile RAM bit cells along a first direction and rows of non-volatile RAM bit cells along a second direction orthogonal to the first direction; and
a plurality of recesses in the top dielectric layer of the substrate, along the first direction between columns of the array of non-volatile RAM bit cells.

2. The semiconductor structure of claim 1, wherein the array of non-volatile RAM bit cells has a pitch along the first direction and has the pitch along the second direction.

3. The semiconductor structure of claim 1, wherein each of the non-volatile RAM bit cells of the array of non-volatile RAM bit cells has, from a plan view perspective, substantially straight edges along the first direction and along the second direction and substantially rounded corners joining the straight edges.

4. The semiconductor structure of claim 1, wherein the array of non-volatile RAM bit cells is an array of spin torque transfer random access memory (STTRAM) bit cells.

5. The semiconductor structure of claim 1, wherein the array of non-volatile RAM bit cells is an array of resistive random access memory (RRAM) bit cells.

6. The semiconductor structure of claim 1, wherein the array of non-volatile RAM bit cells is an array of conductive bridge random access memory (CBRAM) bit cells.

7. The semiconductor structure of claim 1, further comprising:
an additional recess in the top dielectric layer of the substrate, between non-volatile RAM bit cells of a first pairing of adjacent rows of the array of non-volatile RAM bit cells along the second direction.

8. The semiconductor structure of claim 7, wherein a second pairing of adjacent rows of the array of non-volatile RAM bit cells immediately adjacent the first pairing does not include an additional recess in the top dielectric layer of the substrate between non-volatile RAM bit cells of the second pairing.

9. A semiconductor structure, comprising:
a substrate having a top layer;
an array of non-volatile random access memory (RAM) bit cells disposed on the top layer of the substrate, the array of non-volatile RAM bit cells comprising columns of non-volatile RAM bit cells along a first direction and rows of non-volatile RAM bit cells along a second direction orthogonal to the first direction, wherein each of the non-volatile RAM bit cells of the array of non-volatile RAM bit cells has, from a plan view perspective, substantially straight edges along the first direction and along the second direction and substantially rounded corners joining the straight edges.

10. The semiconductor structure of claim 9, wherein the array of non-volatile RAM bit cells has a pitch along the first direction and has the pitch along the second direction.

11. The semiconductor structure of claim 9, further comprising:
a recess in the top layer of the substrate, between non-volatile RAM bit cells of a first pairing of adjacent rows of the array of non-volatile RAM bit cells along the second direction, wherein a second pairing of adjacent rows of the array of non-volatile RAM bit cells immediately adjacent the first pairing does not include a recess in the top layer of the substrate between non-volatile RAM bit cells of the second pairing.

12. The semiconductor structure of claim 9, wherein the array of non-volatile RAM bit cells is an array of spin torque transfer random access memory (STTRAM) bit cells.

13. The semiconductor structure of claim 9, wherein the array of non-volatile RAM bit cells is an array of resistive random access memory (RRAM) bit cells.

14. The semiconductor structure of claim 9, wherein the array of non-volatile RAM bit cells is an array of conductive bridge random access memory (CBRAM) bit cells.

15. A semiconductor structure, comprising:
a substrate having a top layer;
an array of non-volatile random access memory (RAM) bit cells disposed on the top layer of the substrate, the array of non-volatile RAM bit cells comprising columns of non-volatile RAM bit cells along a first direction and rows of non-volatile RAM bit cells along a second direction orthogonal to the first direction, wherein the array of non-volatile RAM bit cells is an array of conductive bridge random access memory (CBRAM) bit cells; and
a plurality of recesses in the top layer of the substrate, along the first direction between columns of the array of non-volatile RAM bit cells.

16. The semiconductor structure of claim 15, wherein the array of non-volatile RAM bit cells has a pitch along the first direction and has the pitch along the second direction.

17. The semiconductor structure of claim 15, wherein each of the non-volatile RAM bit cells of the array of non-volatile RAM bit cells has, from a plan view perspective, substantially straight edges along the first direction and along the second direction and substantially rounded corners joining the straight edges.

18. The semiconductor structure of claim 15, wherein the plurality of recesses does not extend beneath the array of non-volatile RAM bit cells.

19. The semiconductor structure of claim 18, wherein the top layer of the substrate is a dielectric layer, and the plurality of recesses is in the dielectric layer.

20. A semiconductor structure, comprising:
- a substrate having a top layer;
- an array of non-volatile random access memory (RAM) bit cells disposed on the top layer of the substrate, the array of non-volatile RAM bit cells comprising columns of non-volatile RAM bit cells along a first direction and rows of non-volatile RAM bit cells along a second direction orthogonal to the first direction;
- a plurality of recesses in the top layer of the substrate, along the first direction between columns of the array of non-volatile RAM bit cells; and
- an additional recess in the top layer of the substrate, between non-volatile RAM bit cells of a first pairing of adjacent rows of the array of non-volatile RAM bit cells along the second direction, wherein a second pairing of adjacent rows of the array of non-volatile RAM bit cells immediately adjacent the first pairing does not include an additional recess in the top layer of the substrate between non-volatile RAM bit cells of the second pairing.

21. The semiconductor structure of claim 20, wherein the array of non-volatile RAM bit cells has a pitch along the first direction and has the pitch along the second direction.

22. The semiconductor structure of claim 20, wherein each of the non-volatile RAM bit cells of the array of non-volatile RAM bit cells has, from a plan view perspective, substantially straight edges along the first direction and along the second direction and substantially rounded corners joining the straight edges.

23. The semiconductor structure of claim 20, wherein the array of non-volatile RAM bit cells is an array of spin torque transfer random access memory (STTRAM) bit cells.

24. The semiconductor structure of claim 20, wherein the array of non-volatile RAM bit cells is an array of resistive random access memory (RRAM) bit cells.

25. The semiconductor structure of claim 20, wherein the array of non-volatile RAM bit cells is an array of conductive bridge random access memory (CBRAM) bit cells.

* * * * *